US011228322B2

(12) United States Patent
Danilov et al.

(10) Patent No.: US 11,228,322 B2
(45) Date of Patent: *Jan. 18, 2022

(54) REBALANCING IN A GEOGRAPHICALLY DIVERSE STORAGE SYSTEM EMPLOYING ERASURE CODING

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/570,657

(22) Filed: Sep. 13, 2019

(65) Prior Publication Data
US 2021/0083693 A1 Mar. 18, 2021

(51) Int. Cl.
*H03M 13/00* (2006.01)
*H03M 13/29* (2006.01)
*H03M 13/15* (2006.01)

(52) U.S. Cl.
CPC ..... *H03M 13/2906* (2013.01); *H03M 13/154* (2013.01)

(58) Field of Classification Search
None
See application file for complete search history.

(56) References Cited

U.S. PATENT DOCUMENTS

| 5,675,802 | A | 10/1997 | Allen et al. |
| 5,805,788 | A | 9/1998 | Johnson |
| 5,950,225 | A | 9/1999 | Kleiman |
| 6,240,527 | B1 | 5/2001 | Schneider et al. |
| 6,502,243 | B1 | 12/2002 | Thomas |
| 7,103,884 | B2 | 9/2006 | Fellin et al. |
| 7,389,393 | B1 | 6/2008 | Karr et al. |
| 7,577,091 | B2 | 8/2009 | Antal et al. |

(Continued)

OTHER PUBLICATIONS

Y. Ma, T. Nandagopal, K. P. N. Puttaswamy and S. Banerjee, "An ensemble of replication and erasure codes for cloud file systems," 2013 Proceedings IEEE INFOCOM, 2013, pp. 1276-1284, doi: 10.1109/INFCOM.2013.6566920. (Year: 2013).*

(Continued)

*Primary Examiner* — Daniel F. McMahon
(74) *Attorney, Agent, or Firm* — Amin, Turocy & Watson, LLP

(57) ABSTRACT

Rebalancing as a result of re-encoding a code chunk in response to scaling out of a geographically diverse storage system employing erasure coding technology is disclosed. After a scaling out event, a new erasure coding scheme can be selected. An old coding chunk generated according to an old erasure coding scheme can be re-encoded into a new coding chunk according to the new erasure coding scheme and based on a data chunk not previously protected by the old coding chunk. The re-encoding can be selected to diversify distribution of chunks, resulting in rebalancing occurring as part of re-encoding. In an embodiment, the new coding chunk can be generated in a new zone from the scaling out event. In another embodiment, the data chunk can be moved to the new zone from the scaling out event.

20 Claims, 10 Drawing Sheets

(56) References Cited

U.S. PATENT DOCUMENTS

| | | |
|---|---|---|
| 7,631,051 B1 | 12/2009 | Fein et al. |
| 7,664,839 B1 | 2/2010 | Karr et al. |
| 7,680,875 B1 | 3/2010 | Shopiro et al. |
| 7,694,191 B1 | 4/2010 | Bono et al. |
| 7,721,044 B1 | 5/2010 | Chatterjee et al. |
| 7,653,792 B2 | 6/2010 | Shimada et al. |
| 8,125,406 B1 | 2/2012 | Jensen et al. |
| 8,261,033 B1 | 9/2012 | Slik et al. |
| 8,370,542 B2 | 2/2013 | Lu et al. |
| 8,479,037 B1 | 7/2013 | Chatterjee et al. |
| 8,495,465 B1 | 7/2013 | Anholt et al. |
| 8,504,518 B1 | 8/2013 | Ghemawat et al. |
| 8,540,625 B2 | 9/2013 | Miyoshi |
| 8,683,205 B2 * | 3/2014 | Resch ............... G06F 11/2094 713/176 |
| 8,751,599 B2 | 6/2014 | Tran et al. |
| 8,751,740 B1 | 6/2014 | De Forest et al. |
| 8,751,897 B2 | 6/2014 | Borthakur et al. |
| 8,799,746 B2 | 8/2014 | Baker et al. |
| 8,832,234 B1 | 9/2014 | Brooker et al. |
| 8,856,619 B1 | 10/2014 | Cypher |
| 8,856,624 B1 | 10/2014 | Paniconi |
| 8,972,478 B1 | 3/2015 | Storer et al. |
| 9,003,086 B1 | 4/2015 | Schuller et al. |
| 9,021,296 B1 | 4/2015 | Kiselev et al. |
| 9,037,825 B1 | 5/2015 | Donlan et al. |
| 9,052,942 B1 | 6/2015 | Barber et al. |
| 9,063,838 B1 | 6/2015 | Boyle et al. |
| 9,098,447 B1 | 8/2015 | Donlan et al. |
| 9,208,009 B2 | 12/2015 | Resch et al. |
| 9,218,135 B2 | 12/2015 | Miller et al. |
| 9,244,761 B2 | 1/2016 | Yekhanin et al. |
| 9,268,783 B1 | 2/2016 | Shilane et al. |
| 9,274,903 B1 | 3/2016 | Garlapati et al. |
| 9,280,430 B2 | 3/2016 | Sarfare et al. |
| 9,405,483 B1 | 8/2016 | Wei et al. |
| 9,477,682 B1 | 10/2016 | Bent et al. |
| 9,495,241 B2 | 11/2016 | Flynn et al. |
| 9,619,256 B1 | 4/2017 | Natanzon et al. |
| 9,641,615 B1 | 5/2017 | Robins et al. |
| 9,665,428 B2 | 5/2017 | Vairavanathan et al. |
| 9,747,057 B1 | 8/2017 | Ramani et al. |
| 9,817,713 B2 * | 11/2017 | Gupta ............... G06F 11/1064 |
| 9,864,527 B1 | 1/2018 | Srivastav et al. |
| 9,942,084 B1 * | 4/2018 | Sorenson, III ......... H04L 67/02 |
| 10,001,947 B1 | 6/2018 | Chatterjee et al. |
| 10,007,561 B1 | 6/2018 | Pudipeddi et al. |
| 10,055,145 B1 | 8/2018 | Danilov et al. |
| 10,061,668 B1 | 8/2018 | Lazier et al. |
| 10,108,819 B1 | 10/2018 | Donlan et al. |
| 10,127,234 B1 | 11/2018 | Krishnan et al. |
| 10,216,770 B1 | 2/2019 | Kulesza et al. |
| 10,242,022 B1 | 3/2019 | Jain et al. |
| 10,282,262 B2 | 5/2019 | Panara et al. |
| 10,289,488 B1 | 5/2019 | Danilov et al. |
| 10,331,516 B2 | 6/2019 | Danilov et al. |
| 10,361,810 B2 | 7/2019 | Myung et al. |
| 10,387,546 B1 | 8/2019 | Duran et al. |
| 10,496,330 B1 | 12/2019 | Bernat et al. |
| 10,503,611 B1 | 12/2019 | Srivastav et al. |
| 10,567,009 B2 | 2/2020 | Yang et al. |
| 10,579,490 B2 | 3/2020 | Danilov et al. |
| 10,613,780 B1 | 4/2020 | Naeni et al. |
| 10,644,408 B2 | 5/2020 | Sakai et al. |
| 10,705,911 B2 | 7/2020 | Vishnumolakala et al. |
| 10,733,053 B1 * | 8/2020 | Miller ............... G06F 11/1088 |
| 10,740,183 B1 | 8/2020 | Blaum et al. |
| 10,797,863 B2 | 10/2020 | Chen et al. |
| 10,846,003 B2 | 11/2020 | Danilov et al. |
| 2002/0166026 A1 | 11/2002 | Ulrich et al. |
| 2002/0191311 A1 | 12/2002 | Ulrich et al. |
| 2005/0080982 A1 | 4/2005 | Vasilevsky et al. |
| 2005/0088318 A1 | 4/2005 | Liu et al. |
| 2005/0108775 A1 | 5/2005 | Bachar et al. |
| 2005/0140529 A1 | 6/2005 | Choi et al. |
| 2005/0234941 A1 | 10/2005 | Watanabe |
| 2006/0047896 A1 | 3/2006 | Nguyen et al. |
| 2006/0075007 A1 | 4/2006 | Anderson et al. |
| 2006/0143508 A1 | 6/2006 | Mochizuki et al. |
| 2006/0265211 A1 | 11/2006 | Canniff et al. |
| 2007/0076321 A1 | 4/2007 | Takahashi et al. |
| 2007/0239759 A1 | 10/2007 | Shen et al. |
| 2007/0250674 A1 | 10/2007 | Findberg et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2008/0320061 A1 | 12/2008 | Aszmann et al. |
| 2009/0070771 A1 | 3/2009 | Yuyitung et al. |
| 2009/0113034 A1 | 4/2009 | Krishnappa et al. |
| 2009/0172464 A1 | 7/2009 | Byrne et al. |
| 2009/0183056 A1 | 7/2009 | Aston |
| 2009/0204959 A1 | 8/2009 | Anand et al. |
| 2009/0240880 A1 | 9/2009 | Kawaguchi |
| 2009/0259882 A1 | 10/2009 | Shellhamer |
| 2010/0031060 A1 | 2/2010 | Chew et al. |
| 2010/0094963 A1 | 4/2010 | Zuckerman et al. |
| 2010/0174968 A1 | 7/2010 | Charles et al. |
| 2010/0218037 A1 | 8/2010 | Swartz et al. |
| 2010/0293348 A1 | 11/2010 | Ye et al. |
| 2010/0332748 A1 | 12/2010 | Van der Goot et al. |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2011/0138148 A1 | 6/2011 | Friedman et al. |
| 2011/0161712 A1 | 6/2011 | Athalye et al. |
| 2011/0196833 A1 | 8/2011 | Drobychev et al. |
| 2011/0246503 A1 | 10/2011 | Bender et al. |
| 2011/0292054 A1 | 12/2011 | Boker et al. |
| 2012/0023291 A1 | 1/2012 | Zeng et al. |
| 2012/0096214 A1 | 4/2012 | Lu et al. |
| 2012/0191675 A1 | 7/2012 | Kim et al. |
| 2012/0191901 A1 | 7/2012 | Norair |
| 2012/0204077 A1 | 8/2012 | D'Abreu et al. |
| 2012/0233117 A1 | 9/2012 | Holt et al. |
| 2012/0311395 A1 | 12/2012 | Leggette et al. |
| 2012/0317234 A1 | 12/2012 | Bohrer et al. |
| 2012/0321052 A1 | 12/2012 | Morrill et al. |
| 2013/0047187 A1 | 2/2013 | Frazier et al. |
| 2013/0054822 A1 | 2/2013 | Mordani et al. |
| 2013/0067159 A1 | 3/2013 | Mehra |
| 2013/0067187 A1 | 3/2013 | Moss et al. |
| 2013/0088501 A1 | 4/2013 | Fell |
| 2013/0097470 A1 | 4/2013 | Hwang et al. |
| 2013/0145208 A1 | 6/2013 | Yen et al. |
| 2013/0238932 A1 | 9/2013 | Resch |
| 2013/0246876 A1 | 9/2013 | Manssour et al. |
| 2013/0290482 A1 | 10/2013 | Leggette |
| 2013/0305365 A1 | 11/2013 | Rubin et al. |
| 2014/0040417 A1 | 2/2014 | Galdwin et al. |
| 2014/0064048 A1 * | 3/2014 | Cohen .................. G06F 3/065 369/47.15 |
| 2014/0115182 A1 | 4/2014 | Sabaa et al. |
| 2014/0149794 A1 | 5/2014 | Shetty et al. |
| 2014/0164430 A1 | 6/2014 | Hadjieleftheriou et al. |
| 2014/0164694 A1 | 6/2014 | Storer |
| 2014/0250450 A1 | 9/2014 | Yu et al. |
| 2014/0280375 A1 | 9/2014 | Rawson et al. |
| 2014/0281804 A1 | 9/2014 | Resch |
| 2014/0297955 A1 | 10/2014 | Yamazaki et al. |
| 2014/0331100 A1 | 11/2014 | Dhuse et al. |
| 2014/0358972 A1 | 12/2014 | Guarrieri et al. |
| 2014/0359244 A1 | 12/2014 | Chambliss et al. |
| 2014/0380088 A1 | 12/2014 | Bennett et al. |
| 2014/0380125 A1 | 12/2014 | Calder et al. |
| 2014/0380126 A1 | 12/2014 | Yekhanin et al. |
| 2015/0006846 A1 | 1/2015 | Youngworth |
| 2015/0074065 A1 | 3/2015 | Christ et al. |
| 2015/0112951 A1 | 4/2015 | Narayanamurthy et al. |
| 2015/0134626 A1 | 5/2015 | Theimer et al. |
| 2015/0142863 A1 | 5/2015 | Yuen et al. |
| 2015/0160872 A1 | 6/2015 | Chen |
| 2015/0178007 A1 | 6/2015 | Moisa et al. |
| 2015/0186043 A1 | 7/2015 | Kesselman et al. |
| 2015/0269025 A1 | 9/2015 | Krishnamurthy et al. |

(56) References Cited

U.S. PATENT DOCUMENTS

| | | |
|---|---|---|
| 2015/0303949 A1 | 10/2015 | Jafarkhani et al. |
| 2015/0331766 A1 | 11/2015 | Sarfare et al. |
| 2015/0370656 A1 | 12/2015 | Tsafrir et al. |
| 2015/0378542 A1 | 12/2015 | Saito et al. |
| 2016/0011935 A1 | 1/2016 | Luby |
| 2016/0011936 A1 | 1/2016 | Luby |
| 2016/0055054 A1 | 2/2016 | Patterson, III et al. |
| 2016/0085645 A1 | 3/2016 | Buzzard et al. |
| 2016/0162378 A1 | 6/2016 | Garlapati et al. |
| 2016/0169692 A1 | 6/2016 | Gupta |
| 2016/0170668 A1 | 6/2016 | Mehra |
| 2016/0217104 A1 | 7/2016 | Kamble et al. |
| 2016/0232055 A1 | 8/2016 | Vairavanathan et al. |
| 2016/0253400 A1 | 9/2016 | McAlister et al. |
| 2016/0277497 A1 | 9/2016 | Bannister et al. |
| 2016/0292429 A1 | 9/2016 | Bannister et al. |
| 2016/0294419 A1 | 10/2016 | Sandell et al. |
| 2016/0328295 A1 | 11/2016 | Baptist et al. |
| 2016/0357443 A1 | 12/2016 | Li et al. |
| 2016/0357649 A1 | 12/2016 | Karrotu et al. |
| 2016/0371145 A1 | 12/2016 | Akutsu et al. |
| 2016/0378624 A1 | 12/2016 | Jenkins, Jr. et al. |
| 2016/0380650 A1 | 12/2016 | Calder et al. |
| 2017/0003880 A1 | 1/2017 | Fisher et al. |
| 2017/0004044 A1 | 1/2017 | Tormasov et al. |
| 2017/0017671 A1 | 1/2017 | Baptist et al. |
| 2017/0031945 A1 | 2/2017 | Sarab et al. |
| 2017/0097875 A1 | 4/2017 | Jess et al. |
| 2017/0102993 A1 | 4/2017 | Hu et al. |
| 2017/0116088 A1 | 4/2017 | Anami et al. |
| 2017/0187398 A1 | 6/2017 | Trusov |
| 2017/0187766 A1 | 6/2017 | Zheng et al. |
| 2017/0206025 A1 | 7/2017 | Viswanathan |
| 2017/0206135 A1 | 7/2017 | Zeng |
| 2017/0212680 A1 | 7/2017 | Waghulde |
| 2017/0212845 A1 | 7/2017 | Conway |
| 2017/0235507 A1 | 8/2017 | Sinha et al. |
| 2017/0262187 A1 | 9/2017 | Manzanares et al. |
| 2017/0268900 A1 | 9/2017 | Nicolaas et al. |
| 2017/0285952 A1 | 10/2017 | Danilov et al. |
| 2017/0286009 A1 | 10/2017 | Danilov et al. |
| 2017/0286436 A1 | 10/2017 | Neporada et al. |
| 2017/0286516 A1 | 10/2017 | Horowitz et al. |
| 2017/0288701 A1* | 10/2017 | Slik .................. H03M 13/3761 |
| 2017/0344285 A1 | 11/2017 | Choi et al. |
| 2018/0052744 A1 | 2/2018 | Chen et al. |
| 2018/0063213 A1 | 3/2018 | Bevilacqua-Linn et al. |
| 2018/0074881 A1 | 3/2018 | Burden |
| 2018/0121286 A1 | 5/2018 | Sipos |
| 2018/0129417 A1 | 5/2018 | Sivasubramanian et al. |
| 2018/0181324 A1 | 6/2018 | Danilov et al. |
| 2018/0181475 A1 | 6/2018 | Danilov et al. |
| 2018/0181612 A1 | 6/2018 | Danilov et al. |
| 2018/0246668 A1 | 8/2018 | Sakashita et al. |
| 2018/0267856 A1 | 9/2018 | Hayasaka et al. |
| 2018/0267985 A1 | 9/2018 | Badey et al. |
| 2018/0306600 A1 | 10/2018 | Nicolaas et al. |
| 2018/0307560 A1 | 10/2018 | Vishnumolakala et al. |
| 2018/0341662 A1 | 11/2018 | He |
| 2018/0375936 A1 | 12/2018 | Chirammal et al. |
| 2019/0028179 A1 | 1/2019 | Kalhan |
| 2019/0034084 A1 | 1/2019 | Nagarajan et al. |
| 2019/0043201 A1 | 2/2019 | Strong et al. |
| 2019/0043351 A1 | 2/2019 | Yang et al. |
| 2019/0050301 A1 | 2/2019 | Juniwal et al. |
| 2019/0065092 A1 | 2/2019 | Shah et al. |
| 2019/0065310 A1 | 2/2019 | Rozas |
| 2019/0114223 A1* | 4/2019 | Pydipaty ............... G06F 3/0688 |
| 2019/0188079 A1 | 6/2019 | Kohli |
| 2019/0205437 A1 | 7/2019 | Larson et al. |
| 2019/0215017 A1 | 7/2019 | Danilov et al. |
| 2019/0220207 A1 | 7/2019 | Lingarajappa |
| 2019/0356416 A1 | 11/2019 | Yanovsky et al. |
| 2019/0384500 A1 | 12/2019 | Danilov et al. |
| 2019/0386683 A1 | 12/2019 | Danilov et al. |
| 2020/0026810 A1 | 1/2020 | Subramaniam et al. |
| 2020/0042178 A1 | 2/2020 | Danilov et al. |
| 2020/0050510 A1 | 2/2020 | Chien et al. |
| 2020/0104377 A1 | 4/2020 | Earnesty, Jr. et al. |
| 2020/0117556 A1 | 4/2020 | Zou et al. |

OTHER PUBLICATIONS

Non-Final Office Action received for U.S. Appl. No. 16/209,185 dated Jun. 18, 2020, 22 pages.

Martin Hosken, Developing a Hyper-Converged Storage Strategy for VMware vCloud Director with VMware vSAN, Jan. 2018 (Year: 2018).

Non-Final Office Action received for U.S. Appl. No. 16/261,549 dated Apr. 15, 2020, 22 pages.

Non-Final Office Action received for U.S. Appl. No. 16/374,726 dated Jun. 2, 2020, 47 pages.

Natarajan, RAID 0, RAID 1, RAID 5, RAID 10 Explained with Diagrams, Aug. 10, 2010, thegeekstuff.com (18 pages).

Non-Final Office Action received for U.S. Appl. No. 16/177,285 dated Jul. 22, 2020, 31 pages.

Non-Final Office Action received for U.S. Appl. No. 16/261,547 dated Sep. 3, 2020, 26 pages.

Non-Final Office Action received for U.S. Appl. No. 16/261,548 dated Aug. 21, 2020, 42 pages.

Notice of Allowance received for U.S. Appl. No. 16/261,549 dated Jul. 17, 2020, 40 pages.

Qiang et al., "Dynamics Process of Long-running Allocation/Collection in Linear Storage Space", International Conference on Networking, Architecture, and Storage (NAS 2007), Guilin, 2007, pp. 209-216.

Non-Final Office Action received for U.S. Appl. No. 16/374,725 dated Aug. 19, 2020, 50 pages.

Non-Final Office Action received for U.S. Appl. No. 16/511,161 dated Jul. 10, 2020, 24 pages.

Notice of Allowance received for U.S. Appl. No. 15/862,547 dated Mar. 29, 2019 27 pages.

Non-Final Office Action received for U.S. Appl. No. 15/792,714 dated Apr. 4, 2019, 20 pages.

Final Office Action received for U.S. Appl. No. 15/792,714 dated Sep. 12, 2019, 43 pages.

Wikipedia "Garbage Collection", URL: https://en.wikipedia.org/wiki/Garbage_collection_(computer science) #Availability (Year: 2017) retrieved using the WayBackMachine, Sep. 8, 2017, 8 pages.

Wikipedia "Erasure code", URL: https://web.archive.org/web/20170908171158/https://en.wikipedia.org/wiki/Erasure_code (Year: 2017), retrieved using the WayBackMachine, Sep. 8, 2017, 5 pages.

Wikipedia "Front and back ends" URL: https://en.wikipedia.org/wiki/Front_and_back_ends (Year:2019), Sep. 6, 2019, 4 pages.

Notice of Allowance received for U.S. Appl. No. 15/792,714 dated Nov. 8, 2019, 31 pages.

Non-Final Office Action received for U.S. Appl. No. 15/791,390 dated Sep. 20, 2019, 27 pages.

Final Office Action received for U.S. Appl. No. 15/791,390 dated Feb. 6, 2020, 29 pages.

Non-Final Office Action received for U.S. Appl. No. 15/791,390 dated Apr. 30, 2019, 48 pages.

Huang et al., "Scale-RS: An Efficient Scaling Scheme for RS-Coded Storage Clusters," in IEEE Transactions on Parallel and Distributed Systems, vol. 26, No. 6, pp. 1704-1717, Jun. 1, 2015.

Non-Final Office Action received for U.S. Appl. No. 16/457,615 dated Jul. 20, 2020, 34 pages.

Non-Final Office Action received for U.S. Appl. No. 16/228,624 dated Jun. 24, 2020, 65 pages.

Non-Final Office Action received for U.S. Appl. No. 16/240,272 dated Jun. 29, 2020, 64 pages.

Non-Final Office Action received for U.S. Appl. No. 16/228,612 dated Jun. 29, 2020, 62 pages.

Final Office Action received for U.S. Appl. No. 16/010,255 dated Jul. 23, 2020, 36 pages.

Office Action received for U.S. Appl. No. 16/010,246 dated Jul. 27, 2020 36 pages.

(56) References Cited

OTHER PUBLICATIONS

Office Action received for U.S. Appl. No. 16/177,278, dated Aug. 21, 2020, 53 pages.
Office Action received for U.S. Appl. No. 16/179,486, dated Aug. 13, 2020, 64 pages.
Guo et al., "GeoScale: Providing Geo-Elasticity in Distributed Clouds" 2016 IEEE International Conference on Cloud Engineering, 4 pages.
Guo et al., "Providing Geo-Elasticity in Geographically Distributed Clouds". ACM Transactions on Internet Technology, vol. 18, No. 3, Article 38. Apr. 2018. 27 pages.
Office Action received for U.S. Appl. No. 16/254,073, dated Aug. 18, 2020, 62 pages.
Non-Final Office Action received for U.S. Appl. No. 15/651,504 dated Mar. 21, 2019, 10 pages.
Non-Final Office Action received for U.S. Appl. No. 15/662,273 dated Nov. 16, 2018, 19 pages.
Final Office Action received for U.S. Appl. No. 15/662,273 dated May 15, 2019, 33 pages.
Non-Final Office Action received for U.S. Appl. No. 15/965,479 dated Apr. 15, 2019, 21 pages.
Non-Final Office Action received for U.S. Appl. No. 15/794,950 dated Jul. 9, 2019, 29 pages.
Final Office Action received for U.S. Appl. No. 15/651,504 dated Sep. 18, 2019, 15 pages.
Non-Final Office Action received for U.S. Appl. No. 15/952,179 dated Sep. 10, 2019, 42 pages.
Wikipedia, "Standard Raid Levels—RAID 6", URL: https://en.wikipedia.org/wiki/Standard_RAID_levels#RAID_6, Oct. 18, 2019, 11 pages.
Non-Final Office Action received for U.S. Appl. No. 15/656,382 dated Nov. 1, 2019, 47 pages.
Final Office Action received for U.S. Appl. No. 15/952,179 dated Nov. 26, 2019, 53 pages.
Non Final Office Action received for U.S. Appl. No. 16/024,314 dated Nov. 25, 2019, 42 pages.
Non-Final Office Action received for U.S. Appl. No. 16/177,278 dated Dec. 2, 2019, 55 pages.
Non-Final Office Action received for U.S. Appl. No. 15/651,504 dated Dec. 31, 2019, 18 pages.
Non-Final Office Action received for U.S. Appl. No. 16/010,246 dated Dec. 5, 2019, 67 pages.
Stonebreaker et al. "Distributed RAID—A New Multiple Copy Algorithm.", IEEE ICDE, 1990, pp. 430-437.
Muralidhar et al. "f4: Facebook's Warm BLOB Storage System", USENIX. OSDI, Oct. 2014, pp. 383-398.
Final Office Action dated Feb. 12, 2020 for U.S. Appl. No. 16/024,314, 29 pages.
Non-Final Office Action received for U.S. Appl. No. 16/010,255 dated Jan. 9, 2020, 31 pages.
Office Action dated Feb. 5, 2020 for U.S. Appl. No. 16/261,551, 30 pages.
Non-Final Office Action received for U.S. Appl. No. 16/228,612 dated Feb. 27, 2020, 49 pages.
Final Office Action received for U.S. Appl. No. 16/010,246 dated Mar. 16, 2020, 33 pages.
Final Office Action received for U.S. Appl. No. 15/656,382 dated Apr. 6, 2020, 31 pages.
Non-Final Office Action received for U.S. Appl. No. 15/582,167 dated Sep. 7, 2018, 19 pages.
Non-Final Office Action received for U.S. Appl. No. 15/952,179 dated Apr. 20, 2020, 68 pages.
Notice of Allowance dated May 4, 2020 for U.S. Appl. No. 16/240,193, 46 pages.
Office Action dated May 11, 2020 for U.S. Appl. No. 16/177,278, 53 pages.
Office Action dated May 8, 2020 for U.S. Appl. No. 16/231,018, 78 pages.
Notice of Allowance dated May 11, 2020 for U.S. Appl. No. 16/240,193, 24 pages.
Non-Final Office Action received for U.S. Appl. No. 16/399,897 dated Feb. 19, 2021, 56 pages.
Non-Final Office Action received for U.S. Appl. No. 16/670,715 dated Mar. 31, 2021, 60 pages.
Final Office Action received for U.S. Appl. No. 16/177,278 dated Feb. 24, 2021, 109 pages.
EMC; "EMC ECS (Elastic Cloud Storage) Architectural Guide v2.x;" EMC; Jun. 2015; available at: https://www.dell.com/community/s/vjauj58549/attachments/vjauj58549/solutions-ch/477 /1/h14071-ecs-architectural-guide-wp.pdf, Jun. 2015, 21 pages.
Mohan et al., "Geo-aware erasure coding for high-performance erasure-coded storage clusters", Springer Link, URL: https://link.springer.com/article/10.1007/s 12243-017-0623-2, Jan. 18, 2018.
Final Office Action received for U.S. Appl. No. 16/179,486 dated Jan. 28, 2021, 55 pages.
Non-Final Office Action received for U.S. Appl. No. 16/670,746 dated Feb. 16, 2021, 55 pages.
Dell Technologies, "ECS Overview and Architecture", h14071.18, Feb. 2021, 21 Pages.
Non-Final Office Action received for U.S. Appl. No. 16/177,285 dated Apr. 9, 2021, 41 pages.
Non-Final Office Action received for U.S. Appl. No. 16/779,208 dated Apr. 20, 2021, 71 pages.
Notice of Allowance received for U.S. Appl. No. 16/726,428 dated Jun. 14, 2021, 34 pages.
Non-Final Office Action received for U.S. Appl. No. 16/698,096 dated May 24, 2021, 62 pages.
Non-Final Office Action received for U.S. Appl. No. 16/745,855 dated May 13, 2021, 71 pages.
Non-Final Office Action received for U.S. Appl. No. 16/834,649 dated Jun. 24, 2021, 61 pages.
Non-Final Office Action received for U.S. Appl. No. 16/179,486 dated May 12, 2021, 50 pages.
Thomasian et al., "Hierarchical RAID: Design, performance, reliability, and recovery", J. Parallel Distrib. Comput. vol. 72 (2012) pp. 1753-1769.
Non-Final Office Action received for U.S. Appl. No. 16/670,765 dated Jul. 20, 2021, 79 pages.
Non-Final Office Action received for U.S. Appl. No. 16/526,142 dated Oct. 15, 2020, 21 pages.
Notice of Allowance received U.S. Appl. No. 16/228,612 dated Oct. 20, 2020, 84 pages.
Zhou, et al. "Fast Erasure Coding for Data Storage: A Comprehensive Study of the Acceleration Techniques" Proceedings of the 17th Usenix Conference on File and Storage Technologies (FAST '19), [https://www.usenix.org/conference/fast19/presentation/zhou], Feb. 2019, Boston, MA, USA. 14 pages.
Non-Final Office Action received for U.S. Appl. No. 16/010,255 dated Oct. 29, 2020, 65 pages.
Final Office Action received for U.S. Appl. No. 16/240,272 dated Oct. 27, 2020, 42 pages.
Non-Final Office Action received for U.S. Appl. No. 16/399,902 dated Oct. 28, 2020, 83 pages.
Notice of Allowance received for U.S. Appl. No. 16/374,726 dated Nov. 20, 2020, 78 pages.
Final Office Action received for U.S. Appl. No. 16/228,624 dated Dec. 1, 2020, 63 pages.
Final Office Action received for U.S. Appl. No. 16/177,285 dated Dec. 30, 2020, 61 pages.
Final Office Action received for U.S. Appl. No. 16/511,161 dated Dec. 30, 2020, 61 pages.
Non-Final Office Action received for U.S. Appl. No. 16/399,895 dated Jan. 4, 2021, 64 pages.
Notice of Allowance received for U.S. Appl. No. 16/374,726 dated Jan. 6, 2021, 56 pages.
Final Office Action received for U.S. Appl. No. 16/698,096 dated Sep. 7, 2021, 24 pages.
Final Office Action received for U.S. Appl. No. 16/177,285 dated Sep. 14, 2021, 65 pages.
Final Office Action received for U.S. Appl. No. 16/670,715 dated Sep. 7, 2021, 35 pages.
Final Office Action received for U.S. Appl. No. 16/179,486 dated Oct. 20, 2021, 46 pages.

(56) References Cited

OTHER PUBLICATIONS

Notice of Allowance dated Sep. 10, 2021 for U.S. Appl. No. 16/745,855, 30 pages.
Office Action dated Nov. 24, 2021 for U.S. Appl. No. 16/526,182, 83 pages.
Notice of Allowance dated Nov. 22, 2021 for U.S. Appl. No. 16/888,144, 71 pages.

* cited by examiner

REBALANCING IN A GEOGRAPHICALLY DIVERSE STORAGE SYSTEM EMPLOYING ERASURE CODING

TECHNICAL FIELD

The disclosed subject matter relates to data protection, more particularly, to addition of a storage zone to geographically diverse storage zones of a geographically diverse data storage system that can employ erasure coding to protect stored data.

BACKGROUND

Conventional data storage techniques can employ erasure coding technology to conserve storage space for protection of data. As an example, erasure coding can protect data by generating data fragments and erasure coding fragments according to an erasure coding scheme in a manner that uses less space than storing the original data and full copies of the original data. Erasure coding can allow for the recovery of a representation of the original data even where some of the original data or erasure coding fragments are lost, e.g., in a 10+2 erasure coding scheme providing two erasure coding fragments for every 10 data fragments, for a total of 12 fragments, the data can be accessible up to the loss of any two of the 12 fragments. This can make erasure coding an attractive protection mechanism, for example, in bulk data storage.

DETAILED DESCRIPTION

Figure 1:
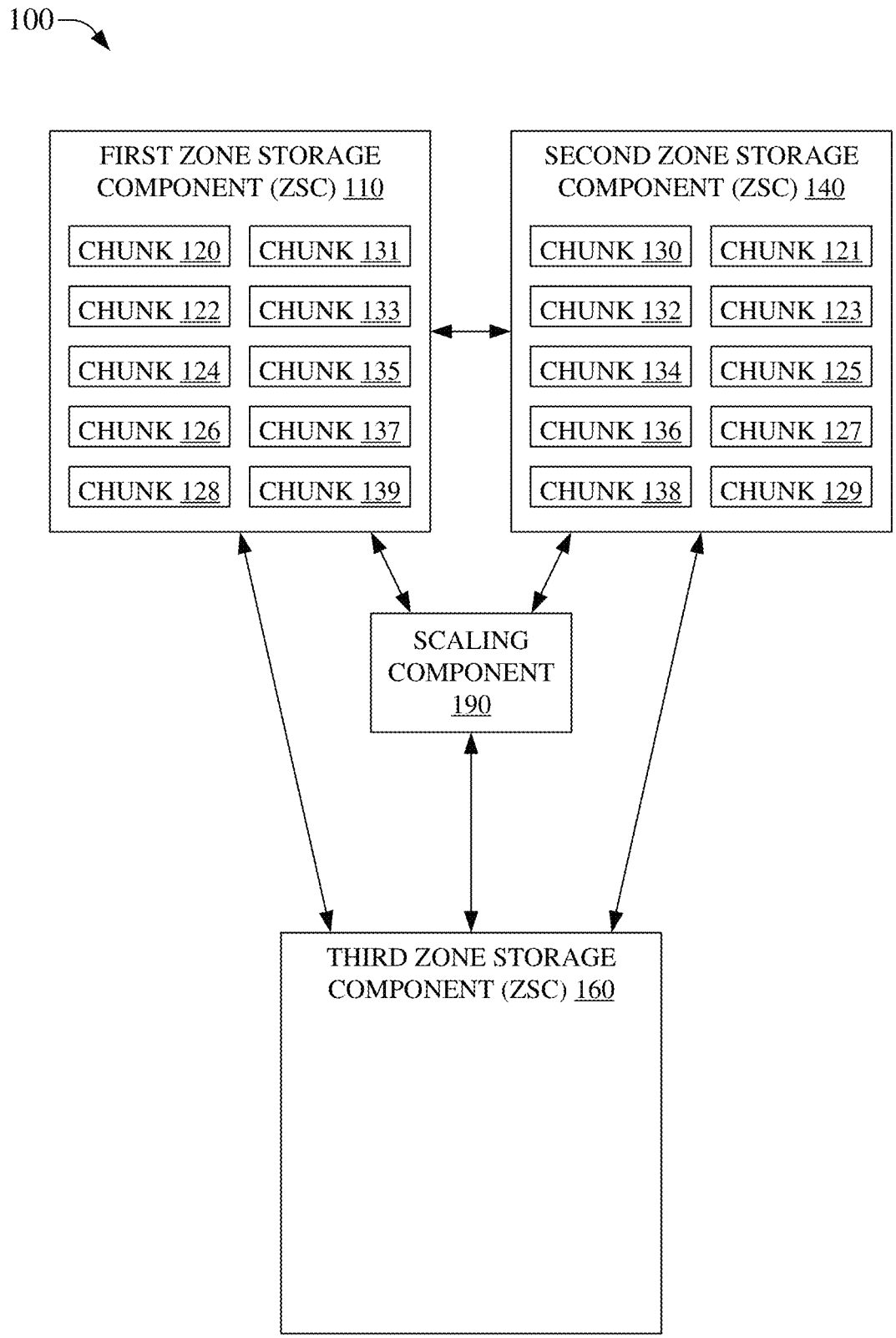
FIG. 1 is an illustration of an example system that can facilitate addition of a storage zone to geographically diverse storage zones of a geographically diverse storage construct, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ convolution and deconvolution to conserve storage space. As an example, convolution can allow data to be packed or hashed in a manner that uses less space that the original data. Moreover, convolved data, e.g., a convolution of first data and second data, etc., can typically be de-convolved to the original first data and second data. One use of data storage is in bulk data storage. Examples of bulk data storage can include networked storage, e.g., cloud storage, for example ECS (formerly Elastic Cloud Storage) offered by Dell EMC. Bulk storage can, in an aspect, manage disk capacity via partitioning of disk space into blocks of fixed size, frequently referred to as chunks, for example a 128 MB chunk, etc. Chunks can be used to store user data, and the chunks can be shared among the same or different users, for example, one chunk may contain fragments of objects from several users. A chunk's content can generally be modified in an append-only mode to prevent overwriting of data already added to the chunk. As such, when a typical chunk becomes full enough, it can be sealed so that the data therein is generally not able for further modification. These chunks can be then stored in a geographically diverse manner to allow for recovery of the data, such as if a first copy of the data is destroyed, e.g., disaster recovery, etc. Blocks of data, hereinafter 'data chunks', or simply 'chunks', can be used to store user data. Chunks from a data storage device, e.g., 'zone storage component' (ZSC), 'zone storage device' (ZSD), etc., located in a first geographic location/area/region, hereinafter a 'zone', etc., can be stored in a second zone storage device that is located at a second geographic location different from the first geographic location. This can enable recovery of data where the first zone storage device is damaged, destroyed, offline, etc., e.g., disaster recovery of data, by accessing the off-site data from the second zone storage device.

In an aspect, geographically diverse data storage can use data compression to store data. As an example, a storage device in Topeka can store a backup of data from a first zone storage device in Houston, e.g., Topeka can be considered geographically diverse from Houston. As a second example, data chunks from Seattle and San Jose can be stored in Denver. The example Denver storage can be compressed or uncompressed, wherein uncompressed indicates that the Seattle and San Jose chunks are replicated in Denver, and wherein compressed indicates that the Seattle and San Jose chunks are convolved, for example via an exclusive-or operation, hereinafter 'XOR', into a different chunk to allow recovery of the Seattle or San Jose data from the convolved chunk, but where the convolved chunk typically consumes less storage space than the sum of the storage space for both the Seattle and San Jose chunks individually. In an aspect, compression can comprise convolving data and decompression can comprise deconvolving data, hereinafter the terms compress, compression, convolve, convolving, etc., can be employed interchangeably unless explicitly or implicitly contraindicated, and similarly, decompress, decompression, deconvolve, deconvolving, etc., can be used interchangeably. Compression, therefore, can allow original data to be recovered from a compressed chunk that consumes less storage space than storage of corresponding uncompressed data chunks. This can be beneficial in that data from a location can be backed up by redundant data in another location via a compressed chunk, wherein a redundant data chunk can be smaller than the sum of the data chunks contributing to the compressed chunk. As such, can be compressed via a convolution technique to reduce the amount of storage space used at a geographically distinct location.

In another aspect, erasure coding (EC) can be employed to provide data protection. In an aspect, erasure coding can protect data in distributed data storage systems and can be employed as an alternative to basic XOR data protect techniques. Generally, erasure coding was created as a forward error correction method for binary erasure channels. However, erasure coding has been applied to data protection in data storage systems. As is disclosed, it can also be applied to data storage and protection in a geographically diverse data storage system.

Erasure coding can comprise dividing some data into k data fragments of equal size. The process of creating coding fragments is typically termed 'encoding,' and during encoding, m coding fragments can be generated from the k data fragments and can provide redundancy to the k data fragments. The process of recovering data fragments using available data and coding fragments is typically termed 'decoding.' Erasure coding can assure that a loss of any m fragments of the m+k total fragments can be tolerated without loss of access to the information represented by the k data fragments. As an example, in a 4+2 EC scheme, four data fragments, A-D, can be employed to generate two coding fragments, E1 and E1', resulting in a protection set of [A, B, C, D, E1, E1'] that can allow access to the information in data fragments A-D up to the loss of more than any two fragments, e.g., [C, D, E1, E1'] can be used to recover A-D, [A, C, D, E1] can be used to recover A-D, [A, C, D, E1'] can be used to recover A-D, etc.

In a geographically diverse data storage system employing erasure coding (ECGEO), it can be designated that the system is to be hardened against the loss of any m zones/clusters/chunks. As such, each zone can replicate each new chunk to at least m other zones. As a result, there can be m backup copies of each chunk, of which one of the m backup chunks can be designated as a primary backup copy, which can be used for encoding. Encoding can be performed by a zone employing primary backup chunks from other zones, e.g., once a first zone has k primary chunks replicated to it from other remote zones, the first zone can generate an encoded chunk. As an example, in a six zone system, chunks A-D can be received at zone E, such that zone E can generate EC chunk E1, and E1 can be replicated as E1' into zone F to provide a distributed 4+2 protection set where chunks A-D, correspondingly from zones A-D, are protected by EC chunk E1 at zone E and E1' at zone F. Encoding at the chunk level can be performed because in the chunks in the disclosed geographically diverse data storage system can be of a fixed chunk size, and a less than full chunk can be padded, or filled via another data complement, on an as needed basis. The result of encoding the k primary chunks is m data portions of chunk size, e.g., from the example, EC chunks E1 and E1'. Generally, the k+m data and coding chunks provide better data protection where they are distributed across different zones. This can be illustrated in the previous example, where were E1 and E1' to be stored on zone B, rather than on zones E and F, then the loss of zone B could result in the loss of three of the six fragments of the protection set, e.g., loss of B, E1, and E1', which could result in a data loss event. Upon generating E1, the primary backup chunks used for encoding and their peer backup chunks at other zones can be deleted where EC chunk E1 can now provide data protection, though typically this is delayed until E1' is also generated at a distributed zone for the example 4+2 EC scheme.

A chunk, e.g., convolved chunk, EC chunk, etc., stored at a geographically diverse storage device, e.g., ZSC, ZSD, in a zone, etc., can comprise data from some or all storage devices of a geographically diverse storage system. As an example, where there are five storage devices corresponding to different storage zones of the geographically diverse storage system, a first zone can comprise unconvolved chunks, convolved chunks, EC chunks, etc., from the other four storage devices to order to provide data protection. In this example, the first storage device can, in an embodiment, create a backup chunk from chunks received from the other four storage devices. In an aspect, this can result in generating copies of the four received chunks at the first storage device and, in some embodiments, then convolving the four chunks to generate a fifth chunk that is a backup of the other four chunks, in other embodiments generating an EC chunk from the four chunks, etc. Moreover, one or more other copies of the four chunks and/or the fifth chunk can be created at the first storage device for redundancy. In another example, the first storage device can convolve or encode chunks from three of the other four storage devices, etc.

In an embodiment of the disclosed subject matter, a first data chunk and a second data chunk corresponding to a first and second zone that are geographically diverse can be represented in a third data chunk stored at third zone that is geographically diverse from the first and second zones. In an aspect the third chunk can represent the data of the first and second data chunks in a compressed form, e.g., the data of the first data chunk and the second data chunk can be convolved, such as by an XOR function, into the third data chunk. In another aspect the third chunk can represent the data of the first and second data chunks as part of a protection set in an encoded form, e.g., the data of the first data chunk and the second data chunk can be employed to encode the third data chunk according to an EC scheme, for example a 2+1 EC scheme. In some embodiments, convolved or encoded chunks can be further convolved or further encoded with other chunks and/or other convolved/encoded chunks to yield a further convolved/encoded chunk. As an example, chunk A can be convolved with chunk B to yield chunk AB, which can be convolved with chunk C to yield chunk ABC, which can be convolved with chunk DEF to yield chunk ABCDEF, etc. As a further example, chunk A and chunk B can be encoded to generate chunk F, which can be employed in re-encoding chunks A-C to yield chunk G, which in turn can be employed in re-encoding chunks A-E to yield chunk H, etc.

In an aspect, as data in chunks becomes stale, old, redundant, etc., it can be desirable to delete these chunks to free storage space for other uses. In an aspect, a convolved chunk can be de-convolved, partially or completely, to yield other chunks, e.g., the other chunks can represent the same data as the convolved chunk, but the other chunks can typically consume more storage space that the convolved chunk because these other chunks are 'less highly convolved'. As an example, the chunk (AB(CD)), which can be chunk A convolved with Chunk B convolved with a chunk that itself is a convolution of chunks C and D, can be deconvolved into chunks A to D, into chunks A, B, and (CD), into chunks A and B(CD), etc. Moreover, in this example, because the convolution can be commutative, such as where an XOR function is used to convolve/deconvolve the data, the chunk (AB(CD)) can be deconvolved into, for example, chunks B and A(CD), chunks A, D, and (BC), etc. Where a chunk is to be deleted in a remote zone, the deconvolution can comprise transfer of other chunks to facilitate the deconvolution. As an example, where the chunk (AB(CD)) is at a first zone, and chunk D is to be deleted, data for one or more of chunks A, B, and C, can be replicated in the first zone from other zones to facilitate deconvolution, e.g., (AB(CD) XOR (ABC), where data for one or more of chunks A, B, and C, is replicated into the first zone, and can result in chunks (ABC) and D, such that chunk D can be deleted and leave just chunk (ABC) at the first zone. As such, it can be desirable to reduce the resource consumption in replicating chunks between zones to facilitate the deletion of a chunk from a convolved chunk. As an example, it can consume less bandwidth to replicate Chunk (ABC) from a second zone to the example first zone as compared to replicating each of Chunk A, Chunk B, and Chunk C from the second zone to the first zone. This can be accommodated, for example, by first, in the second zone, generating a compressed chunk (ABC), such as from chunks A, B, and C, from chunk AB and chunk C, from chunk AC and chunk B, etc., prior to replicating generated chunk ABC into the first zone.

In a similar aspect, where data in chunks becomes stale, old, redundant, etc., and it can be desirable to delete these chunks to free storage space for other uses, for an ECGEO, the data chunk can simply be deleted. In this aspect, a corresponding EC chunk can still regenerate the deleted data chunk. However, the EC chunk can be re-encoded where more than m corresponding data chunks are to be deleted, otherwise where more than m data chunks are deleted, the remaining protected data chunks become vulnerable to a data loss event. As an example, in a 4+2 EC scheme for zones A-F, e.g., data chunks A-D and EC chunks E1 and E1', deleting chunk A still allows for recovery of chunks B, C or D in the event that any one of B, C, or D becomes less available, e.g., [B, D, E1, E1'] can be employed to recover C even after A has been deleted. However, continuing this example, where both A and B have been deleted, loss of C cannot be recovered from remaining [D, E1, E1'] where A and B have already been deleted. As such, where m data chunks of a procreation set are deleted, the protection set can be re-encoded, for example, with other data of zones A and B, with a different EC scheme, etc.

In an aspect, compression/convolution of chunks can be performed by different compression/convolution technologies. Logical operations can be applied to chunk data to allow compressed data to be recoverable, e.g., by reversing the logical operations to revert to an earlier form of chunk data. As an example, data from chunk 1 can undergo an exclusive-or operation, hereinafter 'XOR', with data from chunk 2 to form chunk 3. This example can be reversed by XORing chunk 3 with chunk 2 to generate chunk 1, etc. While other logical and/or mathematical operations can be employed in compression of chunks, those particular operation details are generally beyond the scope of the presently disclosed subject matter and, for clarity and brevity, only the XOR operator will be illustrated herein, however, it is noted that the disclosure is not so limited to just XOR operations and that those other operations or combinations of operations can be substituted without departing from the scope of the present disclosure. As such, all logical and/or mathematical operations for compression germane to the disclosed subject matter are to be considered within the scope of the present disclosure even where not explicitly recited for the sake of clarity and brevity.

Similarly, erasure coding can employ different types of erasure coding. As examples, Reed-Solomon erasure coding, Cauchy erasure coding, Tahoe-LAFS erasure coding, Parchive erasure coding, Erasure Resilient Systematic Code erasure coding, or other types of erasure coding, can be employed in creating erasure coding fragments from data fragments. While the details of employing different types of erasure coding is beyond the scope of the instant disclosure, these types of erasure coding can provide data protection in accord with the disclosed subject matter and, as such, all such types of erasure coding are to be considered within the scope of the instant disclosure, even where not explicitly recited for the sake of clarity and brevity.

In an aspect, the presently disclosed subject matter can, as mentioned, include 'zones'. A zone can correspond to a geographic location or region. As such, different zones, e.g., where a zone can connote a group of ZSCs or ZSDs in a geographic area, etc., can be associated with different geographic locations or regions. As an example, Zone A can comprise Seattle, Wash., Zone B can comprise Dallas, Tex., and, Zone C can comprise Boston, Mass. In this example, where a local chunk from Zone A is replicated in Zone C, or protected by an EC chunk in Zone C, an earthquake in Seattle can be less likely to damage the protection data in Boston. Moreover, a local chunk from Dallas can be convolved with the local Seattle chunk, or be included in encoding an EC chunk in Zone C, which can result in a chunk stored in Boston that can protect the Seattle and/or Dallas chunks. In an embodiment, either the local chunk from Seattle or Dallas can be used to de-convolve the chunk stored in Boston to recover the full set of both the Seattle and Dallas local data chunks. In another embodiment, the Boston EC chunk and the either the Seattle or Dallas chunk can be employed to recover a correspondingly less accessible chunk in either Seattle or Dallas. The Boston chunk can consume less disk space than the sum of the separate Seattle and Dallas local chunks. Of further note, the disclosed subject matter can be employed in more or fewer zones, in zones that are the same or different than other zones, in zones that are more or less geographically diverse, etc. As an example, the disclosed subject matter can be applied to data of a single disk, a memory, a drive, a data storage device, etc., without departing from the scope of the disclosure, e.g., the zones can represent different logical areas of the single disk, memory, drive, data storage device, etc.

In an aspect, a geographically diverse storage construct allows for addition or removal of zones, ZSCs, ZSDs, etc., to/from the construct. As an example, a new zone can be added to a geographically diverse storage system. As another example, a zone can be split into two or more zones by adding other zone storage devices and redefining the extents of corresponding zones, such as splitting a Washington state zone, having ZSCs in the Seattle area, into an Eastern zone and a Western zone by adding ZSCs to the Spokane area and directing storage accordingly. Adding a new zone can comprise adding ZSCs, ZSDs, etc., that represent an 'empty' zone, which can indicate that the storage device(s) of the ZSC, etc., does not yet store data for the zone or other zones of the geographically diverse storage construct.

In an embodiment, it can be desirable to redistribute stored data from some zone(s) into other zone(s) in conjunction with adding a zone, ZSC, etc., to a geographically diverse storage construct. For simplicity and clarity, a new ZSC, as discussed herein, will be treated as an empty zone. However, in some embodiments, a new ZSC can be a non-empty ZSC, e.g., comprising storage device(s) that already comprise stored chunk(s), and all such embodiments are within the scope of the present disclosure even where not explicitly recited for the sake of clarity and brevity. Where a new ZSC is added to a geographically diverse storage construct, some data from other zones can be moved to the new ZSC. In an aspect, this can be to redistribute data chunks to provide better geographic diversity. In another aspect, this can be to alter available storage space on ZSCs of the geographically diverse storage construct. In still another aspect, this can be to utilize data store(s) having different attributes, e.g., monetary cost, energy consumption, space or size of the physical storage device(s), reliability of storage device(s), etc. To enable adding of a new zone, ZSC, ZSD, etc., e.g., 'scaling out' a geographically diverse storage construct, a scaling component can utilize information about the geographically diverse storage construct, the new ZSC, etc., network information, supplemental data, etc., to facilitate the scaling out of the geographically diverse storage construct.

In an embodiment, a scaling component can be communicatively coupled to components of the geographically diverse storage construct, e.g., to ZSC(s), etc., and can be employed to determine data redistribution information. As an example, where a new ZSC is added, a scaling component can rank moving data chunks from a nearly full ZSC to the new ZSC to allow more usable space on the nearly full ZSC. As another example, a scaling component can rank moving data to the new ZSC from a ZSC having more expensive storage costs per unit data higher than moving data from a ZSC having less expensive storage costs, wherein storage costs can be monetary costs, such as equipment prices, dollars per unit energy, land/building costs, etc., or non-momentary costs, such as, energy consumption levels, environmental impacts, man hours of maintenance, availability of services/utilities/skilled workers, etc.

Data from a first ZSC can be moved to a newly added ZSC. In an aspect, data can be moved from several ZSCs to one or more newly added ZSCs. Moreover, the movement of data can comport with geographically diverse data storage techniques, e.g., moving data can result in data storage that comports with geographic diversity of the stored data. As an example, in an embodiment, this can comprise moving a primary backup chunk and a secondary backup chunk so that they end up in different zones to maintain protection of the backed up data. Similar considerations can be afforded other backups of the primary backup chunk, e.g., 3rd, 4th, etc., backup chunks replicating the primary backup chunk, can be moved to retain geographic diversity.

In an aspect, moving data between zones can comprise copying a primary chunk to a new zone and then deleting the primary chunk at the originating zone, thereby effectively "moving" the copy of the primary at the new zone. In some embodiments, moving can be accomplished bit-by-bit, e.g., a bit is copied and then the original bit is deleted, in effect moving the chunk at the bit level. In other embodiments, moving can be accomplished chunk by chunk, e.g., a whole chuck is copied before the original chunk is deleted. In still other embodiments, other groups of data can be moved via the copy and delete technique, e.g., an entire storage device can be copied before the original is deleted, etc.

As will be appreciated, moving data to a new zone can be network intensive because the data being moved would typically be static in the corresponding resident zone and consume minimal, if any, inter-zone network resources, in contrast to large scale copying of data from one zone to another. Additionally, where a new zone receives the moved data, the writing of that data can be processor intensive and increases where the new zone can receive data from one or more zones all trying to distribute data to the new zone. In an aspect, a scaling component can regulate data transfers by indicating when any zone can move data to another zone. In an aspect this can schedule data movement to a newly added zone to moderate network use, etc. As an example, data movement can be scheduled to historically slow network use periods, e.g., late at night, on weekends, over holidays, etc. In a further aspect, this can schedule data movement to a newly added zone to moderate processor use, etc. As an example, data movement can be scheduled to allow data influx from a limited number of zones, e.g., one other zone at a time, etc. In this example, where two zones are to move data into a newly added third zone, the data movement can be scheduled to moderate processor use at the third zone by, for example, scheduling data to move from the first zone before moving data from the second zone, to interleave data movement so that some data is moved from the first zone then some data form the second zone, then some more data from the first zone, then some more data form the second zone, etc.

Additionally, originating zones, e.g., zones moving data towards a newly added zone, etc., can perform operations to combine data, process data, re-encode data, etc., before 'moving data' to alter network usage, processor usage at the new zone, etc. In an aspect, if a first zone is to move data from two chunks to a new zone, the two chunks can be combined, e.g., convolved, re-encoded, etc., as disclosed herein, to consume less storage space prior to moving and, correspondingly, the movement of a combined chunk can consume less network resources and less new zone processor resources in the movement of the combined chunk. The scaling component can indicate which chunks can be combined so as to coordinate data chunk movement to preserve data integrity in the geographically diverse storage construct. As an example, a moving a primary chunk and a secondary chunk in a combined chunk, e.g., the data of the primary and the secondary are combined in the combined chunk, from a first zone to a new zone can be coordinated with moving corresponding chunks from a second zone so that the integrity of the geographically diverse data storage scheme is preserved, e.g., it is generally undesirable to allow combining and/or moving data chunks where it results in data redundancy transitioning a threshold level of redundancy and/or geographic diversity.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate addition of a storage zone to geographically diverse storage zones of a geographically diverse storage system, in accordance with aspects of the subject disclosure. System 100 can comprise first zone storage component (ZSC) 110 that can store data in accord with a geographically diverse storage construct. In an embodiment, ZSC 110 can store data chunks 120-128, etc. In an embodiment, data chunks 120-128, etc., can comprise a data chunk, a redundant or backup data chunk, an erasure coding chunk, a redundant or backup erasure coding chunk, etc. In an aspect, a redundant or backup data chunk can be a copy of a data chunk, e.g., a copy of a chunk of data of the same zone, a copy of a chunk of data from another zone, etc. In an aspect, a redundant or backup erasure coding chunk can comprise a copy of a chunk of erasure coding data, wherein erasure coding data can enable recovery of data according to an erasure coding scheme. In an example scenario, data generated in Seattle can be backed up in a redundant data chunk in a Seattle zone ZSC, in a Dallas zone ZSC, etc. Where erasure coding is employed for data protection, in the example scenario, data generated in Seattle can be protected according to an erasure coding scheme that results in erasure coding data stored in an erasure coding chunk that can be replicated in a redundant erasure coding chunk in the Seattle zone ZSC, in the Dallas zone ZSC, etc. In an aspect, other copies of the data chunk, the redundant data chunk, the erasure coding chunk, the redundant erasure coding chunk, etc., can be stored in the ZSCs of the geographically diverse data storage system. These further redundant chunks, redundant erasure coding chunks, etc., can be regarded as primary, secondary, tertiary, etc. In this manner, a chunk can be backed up, for example, by a primary redundant data chunk, a secondary redundant data chunk, and a tertiary redundant data chunk, that can each represent the data of the corresponding data chunk. Similarly, an erasure coding chunk can be backed up, for example, by a primary redundant erasure coding chunk and a second redundant erasure coding chunk that can each represent the erasure coding data of the erasure coding chunk. For simplicity, the term chunk can refer to a data chunk or erasure coding chunk, etc., and similarly, the term redundant or backup chunk can refer to a redundant chunk or redundant erasure coding chunk, etc. In an aspect, the copies can be mirror images, for example, a secondary redundant chunk can be a copy of a primary redundant chunk, or the copy can provide redundancy even where the content of the 'copied' chunk is modified, e.g., not a mirror image, for example, a secondary redundant chunk can be a combined chunk allowing recreation of the primary redundant chunk data, e.g., via deconvolution, etc., as disclosed elsewhere herein. In an aspect, the secondary redundant chunk can be stored on the same or a different zone, although generally, for geographic diversity, the secondary redundant chunk would typically be stored on another zone. Accordingly, first ZSC 110, in an embodiment, can store chunks 120-128, 131-139, etc. In an embodiment, chunks 131-139, etc., can comprise redundant chunks, e.g., as geographically diverse representations of data stored in other chunks, e.g., chunks 130-138, etc., of second ZSC 140, etc.

Similarly, second ZSC 140 can store chunks 130-138, 121-129, etc. In an embodiment, chunks 130-138, etc., can be chunks that correspond to the earlier example redundant chunks 131-139, etc., of first ZSC 110. Further, in some embodiments, chunks 121-129, etc., can be redundant chunks corresponding to the example chunks 120-128, etc., of first ZSC 110. As such, as an example, first ZSC 110 can have chunks 120-128 that are protected by redundant chunks 121-129 on second ZSC 140. Correspondingly in this example, second ZSC 140 can have chunks 130-138 that are protected by redundant chunks 131-139 on first ZSC 110.

System 100 can comprise scaling component 190 that can be communicatively coupled to ZSCs of a geographically diverse data storage system, e.g., first ZSC 110, second ZSC 140, etc. Scaling component 190 can determine which chunks to replicate, copy, move, etc., to preserve a threshold level of data redundancy, a threshold level of geographic diversity, a threshold level of network resource consumption, monetary cost, processor resource consumption, etc. In an aspect, scaling component 190 can provide information, or an indication, related to adding a new zone, ZSC, ZSD, etc. As an example, where geographic diversity in a two zone system is determined to satisfy a diversity rule, scaling component 190 can indicate that third ZSC 160 should be added. In addition to adding a new zone, e.g., third ZSC 160, etc., in some embodiments, third ZSC 160 can be a dormant zone, e.g., a zone that is already comprised in the geographically diverse storage construct but has gone unused, was less used, etc., and that can be activated, brought into use, used more, etc., for example, in response to a determination by scaling component 190, etc. In an embodiment, scaling component 190 can be located separate from a ZSC, e.g., ZSC 110, 140, 160, etc. In an embodiment, scaling component 190 can be located remotely from a ZSC, e.g., ZSC 110, 140, 160, etc., e.g., both separate from, and located far from, a ZSC. In an embodiment, scaling component 190 can be comprised in a ZSC, e.g., ZSC 110, 140, 160, etc., e.g., scaling component 190 can be part of one or more of the ZSC of the geographically diverse storage system. In an embodiment, scaling component 190 can be comprised in more than one ZSC, e.g., scaling component 190 can be a distributed component comprised in more than one ZSC of the geographically diverse storage system, each ZSC can comprise a separate scaling component 190 that can communicate with other scaling components to coordinate scaling, etc., although these embodiments are not illustrated for clarity and brevity, they are to be considered within the scope of the presently disclosed subject matter.

As is illustrated in system 100, third ZSC 160, for example, can be an empty ZSC that can be available to receive data moved, copied, replicated, etc., from other ZSCs of a geographically diverse data storage system, e.g., one or more of first ZSC 110, second ZSC 140, etc. In an aspect, the movement of chunks, e.g., data chunks, redundant data chunks, erasure coding chunks, redundant erasure coding chunks, etc., into third ZSC 160 can result from determinations by scaling component 190. In an embodiment, scaling component 190 can schedule movement, replication, etc., of one or more chunks from first ZSC 110, and/or one or more chunks from second ZSC 140, into third ZSC 160 in a manner that comports with the geographically diverse storage construct, satisfies cost/resource rules, etc. As an example, scaling component 190 can indicate that all data transfers can occur in low network usage periods, that chunks 120 and 121, e.g., a chunk and a corresponding redundant chunk, are not both moved to third ZSC 160 because it would limit geographic diversity, and that first ZSC 110 moves data at a different time than second ZSC 140 to reduce processor loading at third ZSC 160. Numerous other examples of scaling component 190 coordinating data movement will be readily appreciated and are all considered within the scope of the instant disclosure even where not expressly recited for the sake of clarity and brevity.

Figure 2:
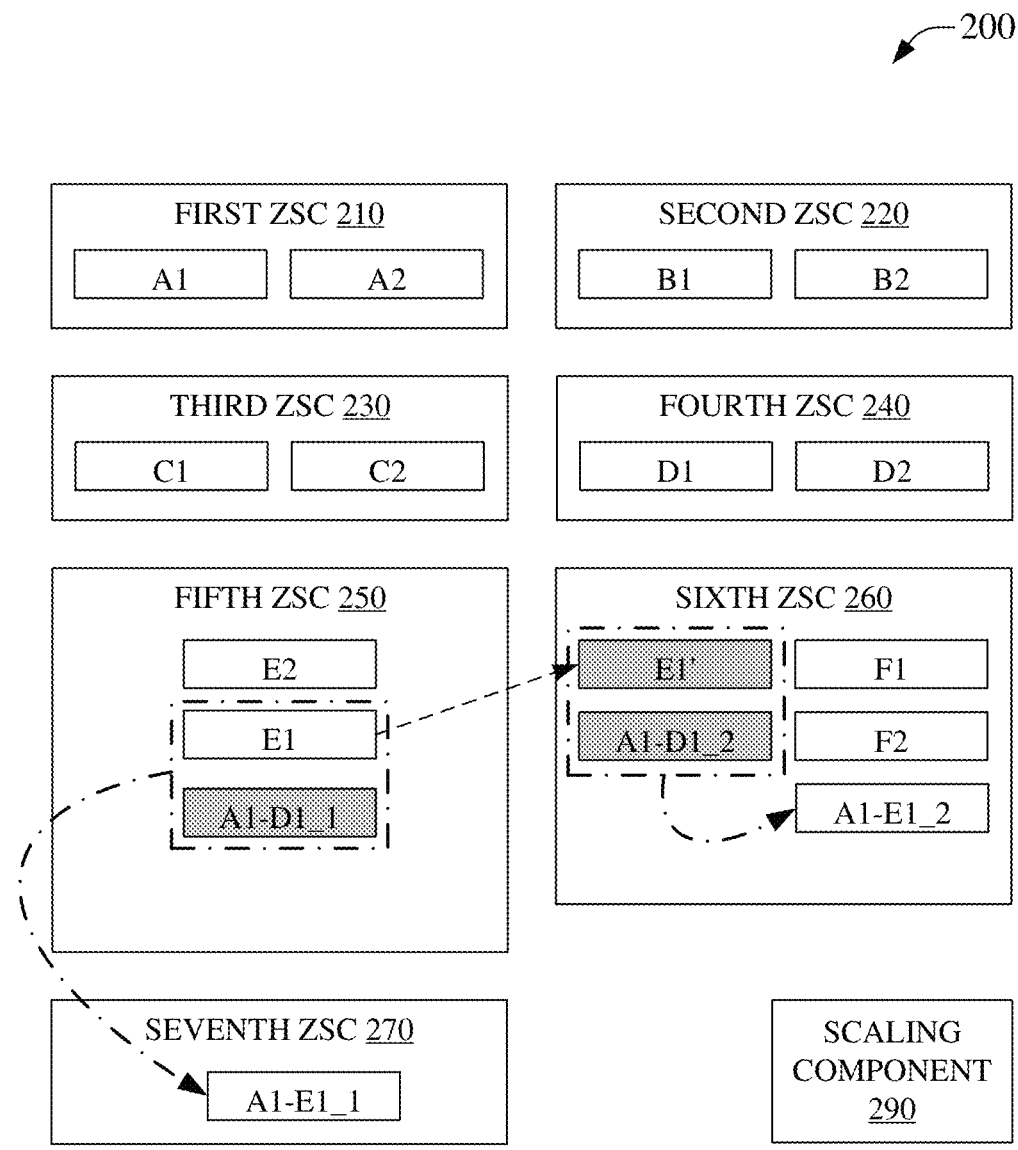
FIG. 2 is an illustration of a system that can favor storing coding chunks on an added storage zone to facilitate addition of a storage zone to geographically diverse storage system employing erasure coding technology, in accordance with aspects of the subject disclosure.

FIG. 2 is an illustration of a system 200, which can favor storing coding chunks on an added storage zone to facilitate addition of a storage zone to geographically diverse storage system employing erasure coding technology, in accordance with aspects of the subject disclosure. System 200 can comprise first ZSC through sixth ZSC, correspondingly 210-260, which can each comprise, among other data chunks, a first data chunk and a second data chunk, e.g., A1 and A2 for first ZSC 210, B1 and B2 for second ZSC 220, C1 and C2 for third ZSC 230, etc. The six ZSCs 210-260 can employ a 4+2 EC scheme that, for example, can result in a protection set of [A1, B1, C1, D1, A1-D1_1, A1-D1_2] where the coding chunk A1-D1_1 can be stored at fifth ZSC 250 and a copy of the coding chunk, e.g., A1-D1_2, can be stored at the sixth ZSC 260. In an aspect, though not illustrated for clarity and brevity, other coding chunks for other protection sets can be stored in among ZSCs 210-260, e.g., a protection set of [C2, D2, E2, F2, C2-F2_1, C2-F2_2] can store coding chunk C2-F2_1 at first ZSC 210 and a copy of the coding chunk, C2-F2_2, can be stored at second ZSC 220 in accord with a best practice of keeping chunks comprising a protection set stored in a fully distributed manner. System 200 can be scaled out, for example, by adding seventh ZSC 270. Utilization of scaled out system 200 can include altering the protection scheme, for example, from a 4+2 EC scheme to a 5+2 EC scheme, and then causing re-encoding of the protection sets. In an aspect, performing the re-encoding as is presently disclosed can result in rebalancing of data stored in the ECGEO of system 200.

In an aspect, data rebalancing can occur in conjunction with data re-protection in scaling out a geographically diverse data storage system employing erasure coding, at least in part, because scaling out of a geographically diverse data storage system employing erasure coding can correspond to alteration of an erasure coding protection scheme. As an example, in a geographically diverse data storage system having six zones and employing erasure coding, the erasure coding protection scheme can be a 4+2 erasure coding scheme (EC scheme), wherein data from any four zones is protected by erasure code stored in the two other zones such that the system is hardened against the loss of any two zones. Where the example six zone geographically diverse data storage system employing erasure coding is scaled out to a seven zone geographically diverse data storage system employing erasure coding, the EC scheme can be altered from the 4+2 EC scheme to a 4+3 EC scheme, a 5+2 EC scheme, etc. It is noted that we discuss the 5+2 EC scheme, rather than all possible EC scheme changes, for clarity and brevity, but all EC scheme changes are considered within the scope of the disclosed subject matter even where not explicitly recited for reasons of clarity and brevity. Altering the 4+2 EC scheme to a 5+2 EC scheme in conjunction with the scaling of the geographically diverse data storage system employing erasure coding, can result in different EC chunks, different redundant EC chunks, etc., because the erasure coding fragments correspond to five other data fragments rather than to four other data fragments, e.g., to five other ZSCs rather than to four other ZSCs.

In an aspect, Erasure Coding can protect data in distributed data storage systems and can be employed as an alternative to basic XOR data protect techniques. Generally, erasure coding was created as a forward error correction method for binary erasure channels. However, erasure coding has been applied to data protection in data storage systems. As is disclosed, it can also be applied to data storage and protection in a geographically diverse data storage system.

Erasure coding can comprise dividing some data into k data fragments of equal size. The process of creating coding fragments is typically termed 'encoding,' and during encoding, m coding fragments can be generated from the k data fragments and can provide redundancy to the k data fragments. The process of recovering data fragments using available data and coding fragments is typically termed 'decoding.' Erasure coding can assure that a loss of any m fragments of the m+k total fragments can be tolerated without loss of access to the information represented by the k data fragments. As an example, in a 4+2 EC scheme, four data fragments, A-D, can be employed to generate two coding fragments, E1 and E1', resulting in a protection set of [A, B, C, D, E1, E1'] that can allow access to the information in data fragments A-D up to the loss of more than any two fragments, e.g., [C, D, E1, E1'] can be used to recover A-D, [A, C, D, E1] can be used to recover A-D, [A, C, D, E1, E1'] can be used to recover A-D, etc.

In a geographically diverse data storage system employing erasure coding, it can be designated that the system is to be hardened against the loss of any m zones/clusters/chunks. As such, each zone can replicate each new chunk to at least m other zones. As a result, there can be m backup copies of each chunk, of which one of the m backup chunks can be designated as a primary backup copy, which can be used for encoding. Encoding can be performed by a zone employing primary backup chunks from other zones, e.g., once a first zone has k primary chunks replicated to it from other remote zones, the first zone can generate an encoded chunk. As an example, in a six zone system, chunks A-D can be received at zone E, such that zone E can generate EC chunk E1, and E1 can be replicated as E1' into zone F to provide a distributed 4+2 protection set where chunks A-D, correspondingly from zones A-D, are protected by EC chunk E1 at zone E and E1' at zone F. Encoding at the chunk level can be performed because in the chunks in the disclosed geographically diverse data storage system can be of a fixed chunk size, and a less than full chunk can be padded, or filled via another data complement, on an as needed basis. The result of encoding the k primary chunks is m data portions of chunk size, e.g., from the example, EC chunks E1 and E1'. Generally, the k+m data and coding chunks provide better data protection where they are distributed across different zones. This can be illustrated in the previous example, where were E1 and E1' to be stored on zone B, rather than on zones E and F, then the loss of zone B could result in the loss of three of the six fragments of the protection set, e.g., loss of B, E1, and E1', which could result in a data loss event. Upon generating E1, the primary backup chunks used for encoding and their peer backup chunks at other zones can be deleted where EC chunk E1 can now provide data protection, though typically this is delayed until E1' is also generated at a distributed zone for the example 4+2 EC scheme.

In an aspect, a geographically diverse data storage system employing erasure coding can provide data protection efficiently, with per chunk capacity overhead being generally described by: overhead=m/k*chunk_size. As an example, a 4+2 EC scheme can have an overhead of 0.5 chunk sizes, e.g., to four chunks of data can be protected in a total of six chunks comprising the four data chunks and two EC chunks.

As another example, in a 10+2 EC scheme, overhead can be 0.2 chunk size. Accordingly, it can be appreciated that scaling out of a geographically diverse data storage system employing erasure coding can result in greater efficiency by reducing the overhead to protect against the loss of a fixed number of zones. As an example, in a six zone system hardened against the loss of any two zones, a 4+2 EC scheme can be employed. If the example system is scaled out to an eight zone system still hardened against the loss of any two zones, then a 6+2 EC scheme can be employed. This can result in overhead going from 50% in the 4+2 EC scheme to 33% in the 6+2 EC scheme while still providing protection against the loss of any two zones in either the six or eight zone geographically diverse data storage system employing erasure coding. In scaling out the system, new EC chunks can generated, for example, in the 4+2 EC scheme, EC chunks E1 and E1' can protect data chunks A-D, while in the 6+2 EC scheme, EC chunks G1 and G1' can protect data chunks A-F and chunks E1 and E1' can then be deleted.

In an aspect, re-protection can be highly burdensome on computing resources, including high processor demand, high network demand, etc. However, it can be observed that EC chunks E1 and E1' can be employed in generating G1 and G1' with reduced burden on computing resources than might be experienced where G1 and G1' are generated de novo. Generally, where there is a protection scheme k+m, there is also a 'coding matrix', e.g., m×k, that can be used to produce m coding fragments out of k data fragments. Any sub-matrix m×l of the matrix m×k (l<k) will then be a proper coding matrix for a protection scheme l+m. As an example, the following three coding matrices for the protection schemes 10+2, 6+2, and 4+2 can share values of coefficients $X_{i,j}$ with the same i and j.

$$CM = \begin{vmatrix} X_{1,1} & X_{1,2} & X_{1,3} & X_{1,4} & X_{1,5} & X_{1,6} & X_{1,7} & X_{1,8} & X_{1,9} & X_{1,10} \\ X_{2,1} & X_{2,2} & X_{2,3} & X_{2,4} & X_{2,5} & X_{2,6} & X_{2,7} & X_{2,8} & X_{2,9} & X_{2,10} \end{vmatrix} \quad (10+2)$$

$$CM = \begin{vmatrix} X_{1,1} & X_{1,2} & X_{1,3} & X_{1,4} & X_{1,5} & X_{1,6} \\ X_{2,1} & X_{2,2} & X_{2,3} & X_{2,4} & X_{2,5} & X_{2,6} \end{vmatrix} \quad (6+2)$$

$$CM = \begin{vmatrix} X_{1,1} & X_{1,2} & X_{1,3} & X_{1,4} \\ X_{2,1} & X_{2,2} & X_{2,3} & X_{2,4} \end{vmatrix} \quad (4+2)$$

Accordingly, re-encoding for a scaling event in an ECGEO can be performed via the example coding matrices with lower computational resource demands than copying all contributing data chunks to a new zone to allow brute force re-encoding. As an example, a protection scheme can be designated for an ECGEO that can be mindful of potential system expansion in future, e.g., a 10+2 EC scheme can be initially selected to allow for future expansion of the ECGEO. Accordingly, in this example, 10+2 ($k_f$+m) can be a potential final protection scheme for a future fully expanded ECGEO system. However, in this example, an initial protection scheme can be selected based on the less than fully expanded ECGEO system, e.g., an initial protection scheme can be selected for the initial number of zones, $N_1$, in the ECGEO system. In this example, let $N_1$=6, and m=2, then an initial k-value, $k_1$, can be determined according to $k_1=N_1-m$, which in this example leads to $k_1$=4, which can assure data recovery after m zone failures, e.g., a first protection scheme in this example can be a 4+2 EC scheme. The protection scheme $k_1$+m can be used for all new data while the ECGEO system is not scaled out. The coding matrix m×$k_1$ can be understood to be a sub-matrix of the coding matrix m×$k_f$ we have chosen for the potential final protection scheme $k_f$+m, e.g., a 10+2 EC scheme.

In this example, when the ECGEO setup is later expanded, for example, by adding two more zones to the system, a new protection scheme can be chosen for the new number of zones, e.g., $N_2$=8. A new k-value, $k_2$, can be calculated using the formula $k_2=N_2-m$, which in this example leads to $k_2$=6. Upon switching the ECGEO system to the new protection scheme, all previously existing coding chunks, e.g., those generated under the 4+2 EC scheme, can be treated as partial coding chunks because the number of data chunks they combine is fewer than $k_2$, e.g., 4<6. Data chunks created by the new zones, in conjunction with the existing partial coding chunks, can be used to re-encode the partial coding chunks, via the coding matrices, to result in coding chunks that are complete under the example 6+2 EC scheme. This can avoid needing to transfer all data chunks to a remote zone for brute force re-encoding. In contrast, new data chunks can be transferred/replicated to the zones with existing partial coding chunks. This can significantly reduce consumption of computing resources including network resources and processor resources. The example 6+2 EC scheme can be similarly adapted to a 7+2 EC scheme, an 8+2 EC scheme, a 9+2 EC scheme, and eventually a 10+2 EC scheme. In some embodiments, further scaling out is also possible, for example, allowing expansion beyond the 10+2 EC scheme. Further discussion of this aspect of data protection is beyond the scope of the instant disclosure. It is sufficient to observe that re-protection of data during a scaling out event in a geographically diverse data storage system employing erasure coding can occur, and that the disclosed technology can enable rebalancing to occur in conjunction with, rather than as a distinct process from, the re-protection. Where rebalancing, as a distinct process, can itself be demanding of computing resources, and where re-protection can similarly be demanding of computing resources, performing rebalancing in conjunction with re-protection can reduce the demand on computing resources, including processor demands, network demands, etc., over performing re-protection and rebalancing as separate processes.

In system 200, adding seventh ZSC 270 can allow for storage of additional chunks, e.g., data chunks, erasure coding chunks, etc. Seventh ZSC 270 can be added as an empty zone, e.g., contacting no chunks, or as a non-empty zone, e.g., already containing one or more chunks. Re-encoding of erasure coding chunks can therefore take advantage of the additional storage space offered by newly added seventh ZSC 270, e.g., the example 4+2 EC scheme can be changed to a 5+2 EC scheme and some chunk(s) can be stored at ZSC 270. This storage at seventh ZSC 270 can be accompanied by removing some other chunk(s) from other ZSCs of system 200, resulting in both re-encoding to the new EC scheme and also providing rebalancing of chunk storage in system 200. This can be performed by selecting chunks for re-encoding in a manner that typically avoids copying of all participating chunks to a new zone before performing re-encoding at the new zone. Selection of chunks can be performed via scaling component 290 that can be communicatively coupled with the ZSCs of system 200. Selection of chunks for re-encoding with rebalancing can be based on one or more selection rules provided to, or via, scaling component 290.

In an aspect, example erasure coding chunk A1-D1_1 can be re-encoded based on data chunk E1 at fifth ZSC 250, resulting in coding chunk A1-E1_1, which can be copied to seventh ZSC 270. This can be in contrast to first copying each of chunks A1, B1, C1, D1, and E1 to seventh ZSC 270 and then encoding A1-E1_1 at seventh ZSC 270, which can consume more computing resources than the illustrated re-encoding at fifth ZSC 250. In an embodiment, A1-E1_1 can be replicated, for diversity, at sixth ZSC 260 from seventh ZSC 270, though this is not illustrated for clarity and brevity. Upon generating A1-E1_1 and A1-E1_2 by this technique, A1-D1_1 and A1-D1_2 can become redundant and can be deleted. Accordingly, fifth ZSC 250 now stores fewer chunks and seventh ZSC 270 stores more chunks.

In an aspect, an alternative to generating A1-E1_1 can be via copying E1 from fifth ZSC 250 to Sixth ZSC 260 as E1'. E1' can then be used to re-encode A1-D1_2 at sixth ZSC 260, resulting in A1-E1_2. A1-E1_2 can then be replicated from sixth ZSC 260 into seventh ZSC 270 as A1-E1_1 for diversity, again this is not illustrated for clarity and brevity. Upon generating A1-E1_1 and A1-E1_2 by this technique, A1-D1_1, E1', and A1-D1_2 can be redundant and can be deleted. Accordingly, fifth ZSC 250 now stores fewer chunks and seventh ZSC 270 stores more chunks.

In some embodiments, A1-E1_1 and A1-E1_2 can be generated separately, though they can be equivalent, e.g., A1-E1_1 can be generated by re-encoding A1-D1_1 based on E1 and A1-E1_2 can be generated by replicating E1 as E1' and re-encoding A1-D1_2 based on E1', as illustrated. However, it can be easier to envision A1-E1_2 as a copy of A1-E1_1, e.g., replicated from seventh ZSC 270 into sixth ZSC 260, where A1-E1_1 is generated via re-encoding A1-D1_1 based on E1, or envisioning A1-E1_1 as a copy of A1-E1_2, e.g., replicated from sixth ZSC 260 into seventh ZSC 270 where A1-E1_2 is generated via re-encoding A1-D1_2 based on E1'. However, either illustrated pathway, or a combination of both illustrated pathways, can result in generating the redundant pair of coding chunks, e.g., A1-E1_1 and A1-E1_2, as part of the 5+2 EC scheme protection set [A1, B1, C1, D1, E1, A1-E1_1, A1-E1_2] that can enable access to information represented in [A1, B1, C1, D1, E1] up to the loss of any two chunks of the 5+2 EC protection set, e.g., loss of, or reduced access to, any two zones of ZSCs 210-270.

Scaling component 290 can communicate with one or more of the ZSCs of system 200 to orchestrate moving, copying, re-encoding, etc., chunks in an ECGEO, e.g., system 200. In an embodiment, scaling component 290 can initiate chunk operations between ZSCs, e.g., copying E1 from fifth ZSC 250 to Sixth ZSC 260 as E1', writing A1-E1_1 into seventh ZSC 270 in response to re-encoding of A1-D1_1 based on E1, copying A1-E1_1 as A1-E1_2 from seventh ZSC 270 into sixth ZSC 260, enabling re-encoding of A1-D1_2 into A1-E1_2 based on E1', etc. Moreover, the ZSCs, in response to notification of the completion of a chunk operation can perform other actions, e.g., deleting a local chunk that has been copied into another zone, etc. As an example, in response to generating A1-E1_1 and A1-E1_2, redundant chunks can be deleted, e.g., A1-D1_1, E1'_A1-D1_2, etc.

In an embodiment, scaling component 290 can determine which technique to apply, e.g., based on one or more selection rules, to one or more chunk operations in regard to the disclosed subject matter. In an example, scaling component 290 can determine that there are adequate network resources and that sixth ZSC 260 has a less burdened processor than fifth ZSC 250 and, based on a selection rule to least burden computing resources, can accordingly instruct fifth ZSC 250 to copy E1 to sixth ZSC 260 as E1', so that the processor of sixth ZSC 260 is tasked with generating A1-E1_2 rather than the processor of fifth ZSC 250 being tasked with generating A1-E1_1. In another example, scaling component 290 can determine that while there can be adequate network resources, sixth ZSC 260 can be a more burdened processor than fifth ZSC 250 and, accordingly, can instruct fifth ZSC 250 to generate A1-E1_1 rather than copying E1 to sixth ZSC 260, etc. In a further example, scaling component 290 can determine that there can be adequate computing resources for seventh ZSC 270 to perform a brute force re-encoding, wherein A1, B1, C1, D1, and E1, can be copied to seventh ZSC 270 to facilitate encoding of A1-E1_1 at ZSC 270, resulting in less computing resource demand on fifth ZSC 250 and sixth ZSC 260. Numerous other examples of rule based selection via scaling component 290 will be readily appreciated and all such examples are within the scope of the instant disclosure even where not recited explicitly for the sake of clarity and brevity.

Figure 3:
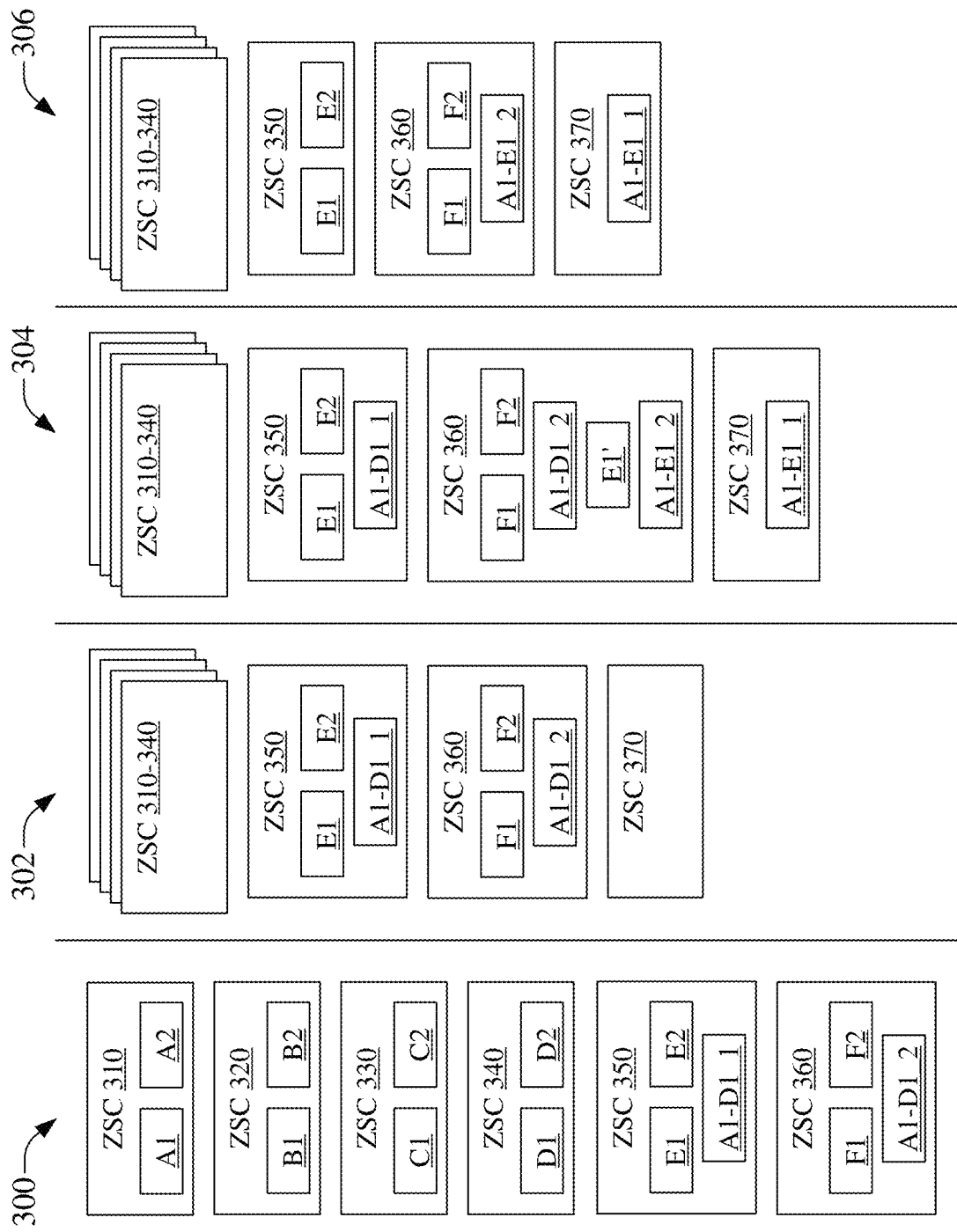
FIG. 3 is an illustration of example states of a system that can favor storing coding chunks on an added storage zone to facilitate addition of a storage zone to geographically diverse storage system employing erasure coding technology, in accordance with aspects of the subject disclosure.

FIG. 3 is an illustration of example states 300-306 of a system, e.g., system 200, which can favor storing coding chunks on an added storage zone to facilitate addition of a storage zone to geographically diverse storage system employing erasure coding technology, in accordance with aspects of the subject disclosure. A first state, e.g., example state 300, can represent an ECGEO that can comprise ZSC 310 through ZSC 360, e.g., employing a 4+2 EC scheme at state 300. At state 300, the ZSCs can comprise data chunks A1 through F2 and coding chunks A1-D1_1 and A1-D1_2 as illustrated. The ECGEO can be scaled out at state 302, e.g., adding ZSC 370. At state 302, ZSC 310-340 can comprise data chunks A1-D2, although not illustrated for clarity and brevity. Further, ZSC 350 and ZSC 360 can still comprise the same chunks as in state 300.

The ECGEO, at state 304, can generate A1-E1_1, e.g., re-encoding coding chunks according to changing from the example 4+2 EC scheme to an example 5+2 EC scheme, such as is disclosed for system 200, etc. In some embodiments, A1-E1_1 can be generated by re-encoding A1-D1_1 based on E1 at ZSC 350 and writing A1-E1_1 into ZSC 370. In some embodiments, A1-E1_1 can be generated by copying E1 and A1-D1_1 from ZSC 350 into ZSC 370 and then re-encoding A1-D1_1 based on E1 at ZSC 370, although this embodiment is not illustrated for clarity and brevity. In some embodiments, E1 can be copied into ZSC 360 as E1' and A1-E1_2 can be generated by re-encoding A1-D1_2, e.g., as a redundant copy of A1-E1_1, based on E1' at ZSC 360 and copying A1-E1_2 as A1-E1_1 into ZSC 370. In some embodiments, A1-E1_1 can be generated by re-encoding A1-D1_1 based on E1 and A1-E1_2 can be separately generated by re-encoding A1-D1_2 with E1'.

As can be observed in FIG. 3, re-encoding via the disclosed processes can result in more redundant chunks than are needed to provide data protection according to the example 5+2 EC scheme, e.g., A1-D1_1, E1', and A1-D1_2 can be considered unnecessary in view of A1-E1_1 and A1-E1_2 having been generated via one or more of the disclosed pathways. The ECGEO can remove unnecessary chunks, e.g., clean up the stored chunks, at 360. In an embodiment, where generating A1-E1_1 and A1-E1_2 provides data protection via the example 5+2 EC scheme, A1-D1_1, E1', and A1-D1_2 can be deleted, released, etc. As such, at state 306, ZSC 310-340 can still comprise chunks A1-D2, ZSC 350 can comprise fewer chunks than in state 300, e.g., E1 and E2 rather than E1, E2, and A1-D1_1, ZSC 360 can now comprise F1, F2, and A1-E1_2 rather than F1, F2, and A1-D1_2, and newly added ZSC 370 can now comprise A1-E1_1. This can demonstrate that the selective re-encoding can provide rebalancing of the ECGEO without needing to perform rebalancing as a distinct process.

Figure 4:
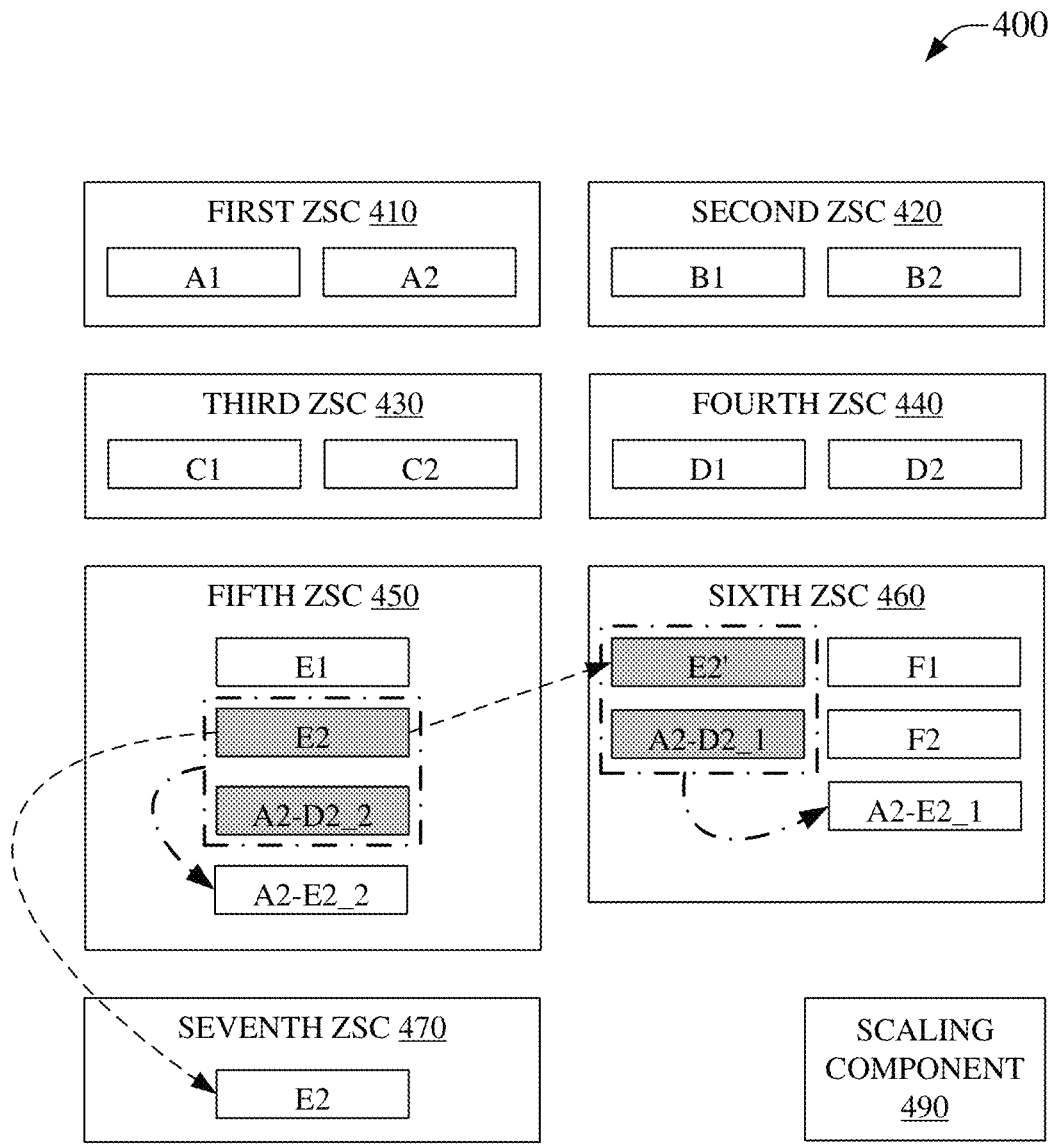
FIG. 4 is an illustration of a system that can favor storing coding chunks on existing storage zones to facilitate addition of a storage zone to geographically diverse storage system employing erasure coding technology, in accordance with aspects of the subject disclosure.

FIG. 4 is an illustration of a system 400, which can favor storing coding chunks on existing storage zones to facilitate addition of a storage zone to geographically diverse storage system employing erasure coding technology, in accordance with aspects of the subject disclosure. System 400 can comprise first ZSC through sixth ZSC, correspondingly 410-460, which can each comprise, among other data chunks, a first data chunk and a second data chunk, e.g., A1 and A2 for first ZSC 410, B1 and B2 for second ZSC 420, C1 and C2 for third ZSC 430, etc. The six ZSCs 410-460 can employ a 4+2 EC scheme that, for example, can result in a protection set of [A2, B2, C2, D2, A2-D2_1, A2-D2_2] where the coding chunk A2-D2_1 can be stored at sixth ZSC 460 and a copy of the coding chunk, e.g., A2-D2_2, can be stored at the fifth ZSC 450. In an aspect, though not illustrated for clarity and brevity, other coding chunks for other protection sets can be stored in among ZSCs 410-460, e.g., a protection set of [C1, D1, E1, F1, C1-F1_1, C1-F1_2] can store coding chunk C1-F1_1 at first ZSC 210 and a copy of the coding chunk, C1-F1_2, can be stored at second ZSC 420 in accord with a best practice of keeping chunks comprising a protection set stored in a fully distributed manner. System 400 can be scaled out, for example, by adding seventh ZSC 470. Utilization of scaled out system 400 can include altering the protection scheme, for example, from a 4+2 EC scheme to a 5+2 EC scheme, and then causing re-encoding of the protection sets. In an aspect, performing the re-encoding as is presently disclosed can again result in rebalancing of data stored in the ECGEO of system 400.

In system 400, adding seventh ZSC 470 can allow for storage of additional chunks, e.g., data chunks, erasure coding chunks, etc. Seventh ZSC 470 can be added as an empty zone or as a non-empty zone. Re-encoding of erasure coding chunks can therefore take advantage of the additional storage space offered by newly added seventh ZSC 470, e.g., the example 4+2 EC scheme can be changed to a 5+2 EC scheme and some chunk(s) can be stored at ZSC 470. This storage at seventh ZSC 470 can be accompanied by removing some other chunk(s) from other ZSCs of system 400, resulting in both re-encoding to the new EC scheme and also providing rebalancing of chunk storage in system 400. This can be performed by selecting chunks for re-encoding in a manner that can avoid copying of all participating chunks to a new zone before performing re-encoding at the new zone. Selection of chunks can be performed via scaling component 490 that can be communicatively coupled with the ZSCs of system 400. Selection of chunks for re-encoding with rebalancing can be based on one or more selection rules provided to, or via, scaling component 490.

In an aspect, example erasure coding chunk A2-D2_1 can be re-encoded based on a data chunk E2, e.g., E2', at sixth ZSC 460, resulting in coding chunk A2-E2_1. This process can be in contrast to first copying each of chunks A2, B2, C2, D2, and E2 to sixth ZSC 460 and then encoding A2-E2_1, which can consume more computing resources than the illustrated re-encoding at sixth ZSC 460 based on A2-D2_1 and E2'. In some embodiments, although not illustrated for clarity and brevity, A2-E2_1 can then be copied to fifth ZSC 450 as A2-E2_2 to provide storage diversity of the coding chunk. Upon generating A2-E2_1 and A2-E2_2 by this technique, A2-D2_1 and A2-D2_2 can be considered excessively redundant and can be deleted. Further, E2 can be safely moved to seventh ZSC 470 from fifth ZSC 450. Accordingly, fifth ZSC 450 can now store fewer chunks and seventh ZSC 470 can now store more chunks.

In an aspect, an alternative to generating A2-E2_2 can be via re-encoding A2-D2_2 based on E2 at fifth ZSC 450, then copying A2-D2_2 to Sixth ZSC 460 as A2-D2_1. A2-E2_2 can then be replicated from sixth ZSC 460 into seventh ZSC 470 as A2-E2_1 for chunk diversity, which is not illustrated for clarity and brevity. E2 can then be safely moved to seventh ZSC 470 from fifth ZSC 450. Upon generating A2-E2_1 and A2-E2_2 by this technique, A2-D2_1, E2', and A2-D2_2 can be redundant and can be deleted. Accordingly, fifth ZSC 450 now stores fewer chunks and seventh ZSC 470 stores more chunks.

In some embodiments, A2-E2_1 and A2-E2_2 can be generated separately, though, as in system 200, they can again be equivalent, e.g., A2-E2_2 can be generated by re-encoding A2-D2_2 based on E2 and A2-E2_2 can be generated by replicating E2 as E2' and re-encoding A2-D2_1 based on E2', as illustrated. However, it can be easier to envision A2-E2_1 as a copy of A2-E2_2, e.g., replicated from fifth ZSC 450 into sixth ZSC 460, where A2-E2_2 is generated via re-encoding A2-D2_2 based on E2, or envisioning A2-E2_2 as a copy of A2-E2_1, e.g., replicated from sixth ZSC 460 into fifth ZSC 450 where A2-E2_1 is generated via re-encoding A2-D2_1 based on E2'. However, either illustrated pathway, or a combination of both illustrated pathways, can result in generating the redundant pair of coding chunks, e.g., A2-E2_1 and A2-E2_2, as part of the example 5+2 EC scheme protection set [A2, B2, C2, D2, E2, A2-E2_1, A2-E2_2] that can enable access to information represented in [A2, B2, C2, D2, E2] up to the loss of any two chunks of the 5+2 EC protection set, e.g., loss of, or reduced access to, any two zones of ZSCs 410-470.

Scaling component 490 can communicate with one or more of the ZSCs of system 400 to orchestrate moving, copying, re-encoding, etc., chunks in an ECGEO, e.g., system 400. In an embodiment, scaling component 490 can initiate chunk operations between ZSCs, e.g., copying E2 from fifth ZSC 450 to Sixth ZSC 460 as E2', re-encoding of A2-D2_2 based on E2, copying A2-E2_2 as A2-E2_1 from fifth ZSC 450 into sixth ZSC 460, enabling re-encoding of A2-D2_1 into A2-E2_1 based on E2', etc. Moreover, the ZSCs, in response to notification of the completion of a chunk operation can perform other actions, e.g., deleting a local chunk that has been copied into another zone, etc. As examples, in response to generating A2-E2_1 and A2-E2_2, redundant chunks can be deleted, e.g., A2-D2_1, E2'_A2-D2_2, E2 can be moved to another ZSC, etc.

In an embodiment, scaling component 490 can determine which technique to apply, e.g., based on one or more selection rules, to one or more chunk operations in regard to the disclosed subject matter. In an example, scaling component 490 can determine that there are adequate network resources and that sixth ZSC 460 has a less burdened processor than fifth ZSC 450 and, based on a selection rule to least burden computing resources, can accordingly instruct fifth ZSC 450 to copy E2 to sixth ZSC 460 as E2', so that the processor of sixth ZSC 460 is tasked with generating A2-E2_1, then copying A2-E2_1 back to fifth ZSC 450 as A2-E2_2, rather than the processor of fifth ZSC 450 being tasked with generating A2-E2_2. In another example, scaling component 490 can determine that while there can be adequate network resources, sixth ZSC 460 can be a more burdened processor than fifth ZSC 450 and, accordingly, can instruct fifth ZSC 450 to generate A2-E2_2 rather than copying E2 to sixth ZSC 460, etc. Numerous other examples of rule based process selection via scaling component 490 will be readily appreciated and all such examples are within the scope of the instant disclosure even where not recited explicitly for the sake of clarity and brevity.

Figure 5:
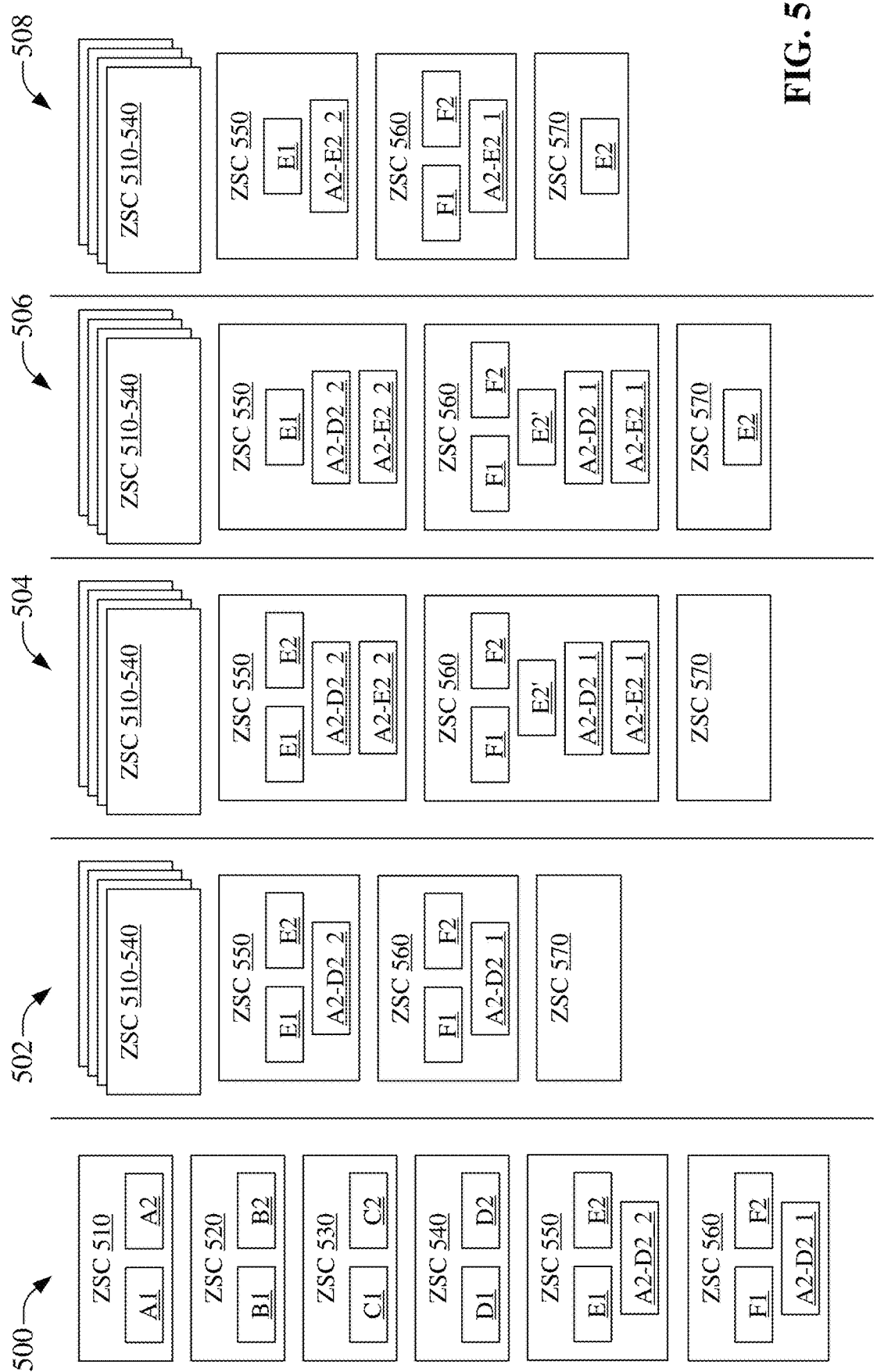
FIG. 5 is an illustration of example states of a system that can favor storing coding chunks on existing storage zones to facilitate addition of a storage zone to geographically diverse storage system employing erasure coding technology, in accordance with aspects of the subject disclosure.

FIG. 5 is an illustration of example states 500-506 of a system, e.g., system 400, which can favor storing coding chunks on existing storage zones to facilitate addition of a storage zone to geographically diverse storage system employing erasure coding technology, in accordance with aspects of the subject disclosure. A first state, e.g., example state 500, can represent an ECGEO that can comprise ZSC 510 through ZSC 560, e.g., employing a 4+2 EC scheme at state 500. At state 500, the ZSCs can comprise data chunks A1 through F2 and coding chunks A2-D2_1 and A2-D2_2 as illustrated. The ECGEO can be scaled out at state 502, e.g., adding ZSC 570. At state 502, ZSC 510-540 can comprise data chunks A1-D2, although not illustrated for clarity and brevity. Further, ZSC 550 and ZSC 560 can still comprise the same chunks as in state 500.

The ECGEO, at state 504, can generate A2-E2_2, e.g., re-encoding coding chunks according to changing from the example 4+2 EC scheme to an example 5+2 EC scheme, such as is disclosed for system 400, etc. In some embodiments, A2-E2_2 can be generated by re-encoding A2-D2_2 based on E2 at ZSC 550. In some embodiments, A2-E2_2 can be generated by copying E2 from ZSC 550 into ZSC 560 a s E2', re-encoding A2-D2_1 based on E2' at ZSC 560, then copying A2-E2_1 back to ZSC 550 as A2-E2_2. In some embodiments, A2-E2_1 can be generated by re-encoding A2-D2_1 based on E2' and A2-E2_2 can be separately generated by re-encoding A2-D2_2 with E1. At state 506, E2 can be moved from ZSC 3550 to ZSC 570.

As can be observed in FIG. 5, re-encoding via the disclosed processes can result in more redundant chunks than are needed to provide data protection according to the example 5+2 EC scheme, e.g., A2-D2_1, E2', and A2-D2_2 can be considered unnecessary in view of A2-E2_1 and A2-E2_2 having been generated via one or more of the disclosed pathways. The ECGEO can remove unnecessary chunks, e.g., clean up the stored chunks, at state 508. In an embodiment, where generating A1-E1_1 and A1-E1_2 provides data protection via the example 5+2 EC scheme, A1-D1_1, E1', and A1-D1_2 can be deleted, released, etc. As such, at state 508, ZSC 510-540 can still comprise chunks A1-D2, ZSC 550 can comprise fewer chunks than in state 500, e.g., E1 and A2-E2_2 rather than E1, E2, and A2-D2_2, ZSC 560 can now comprise F1, F2, and A2-E2_1 rather than F1, F2, and A2-D2_1, and newly added ZSC 570 can now comprise E2.

Figure 6:
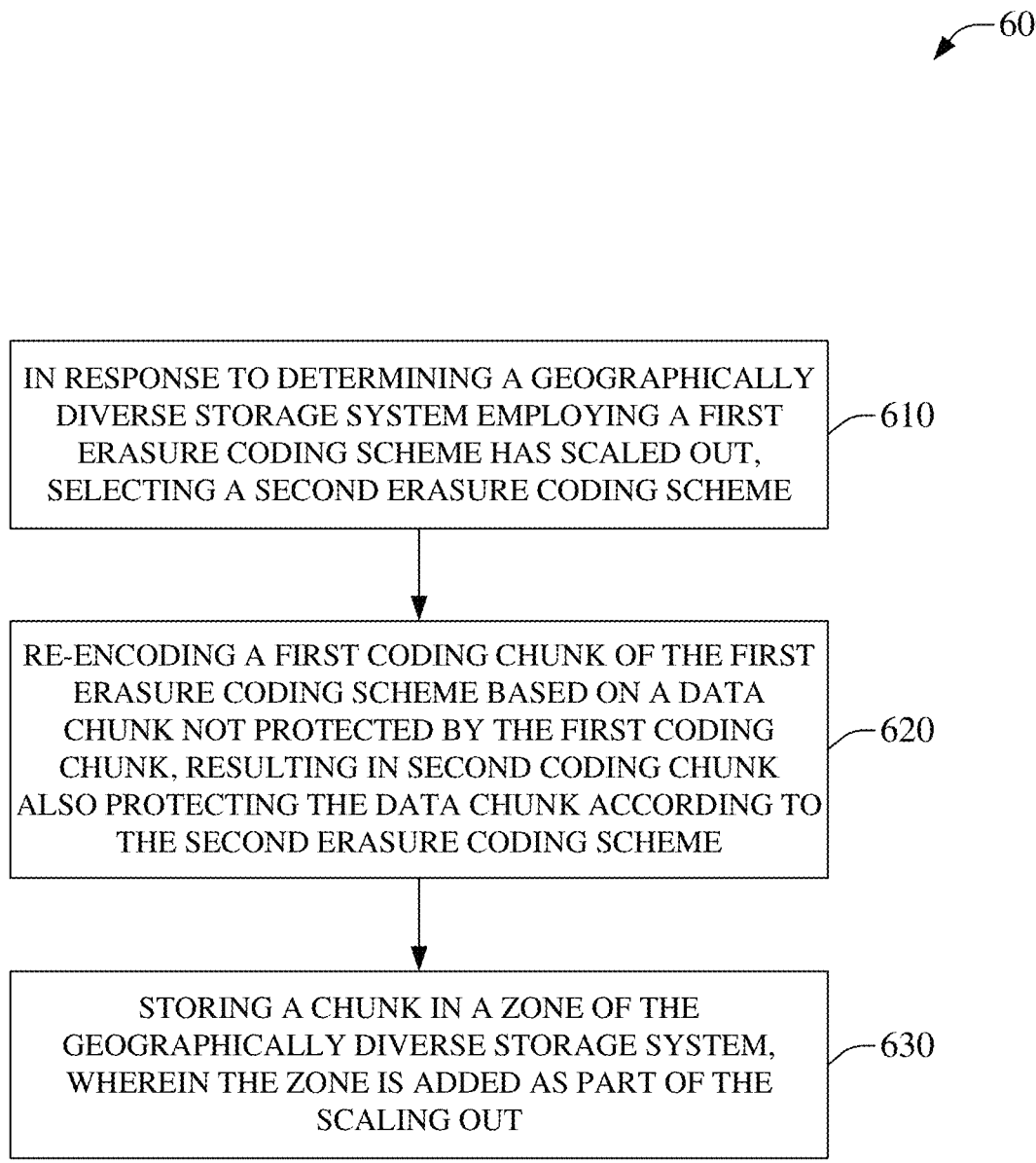
FIG. 6 is an illustration of an example method enabling addition of a storage zone to geographically diverse storage zones of a geographically diverse storage construct employing erasure coding technology, in accordance with aspects of the subject disclosure.
Figure 7:
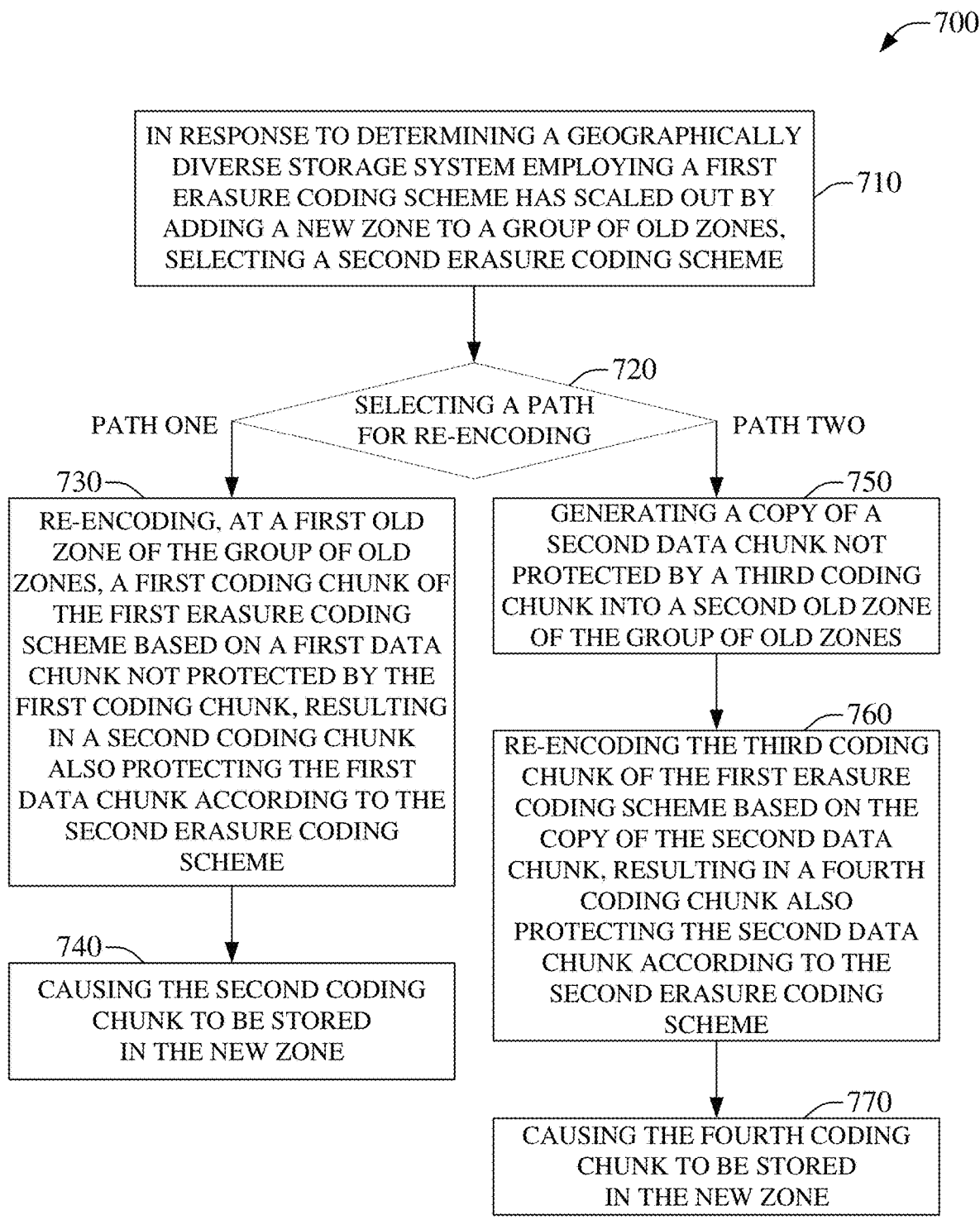
FIG. 7 is an illustration of an example method facilitating preferentially storing coding chunks on an added storage zone to facilitate addition of a storage zone to geographically diverse storage system employing erasure coding technology, in accordance with aspects of the subject disclosure.
Figure 8:
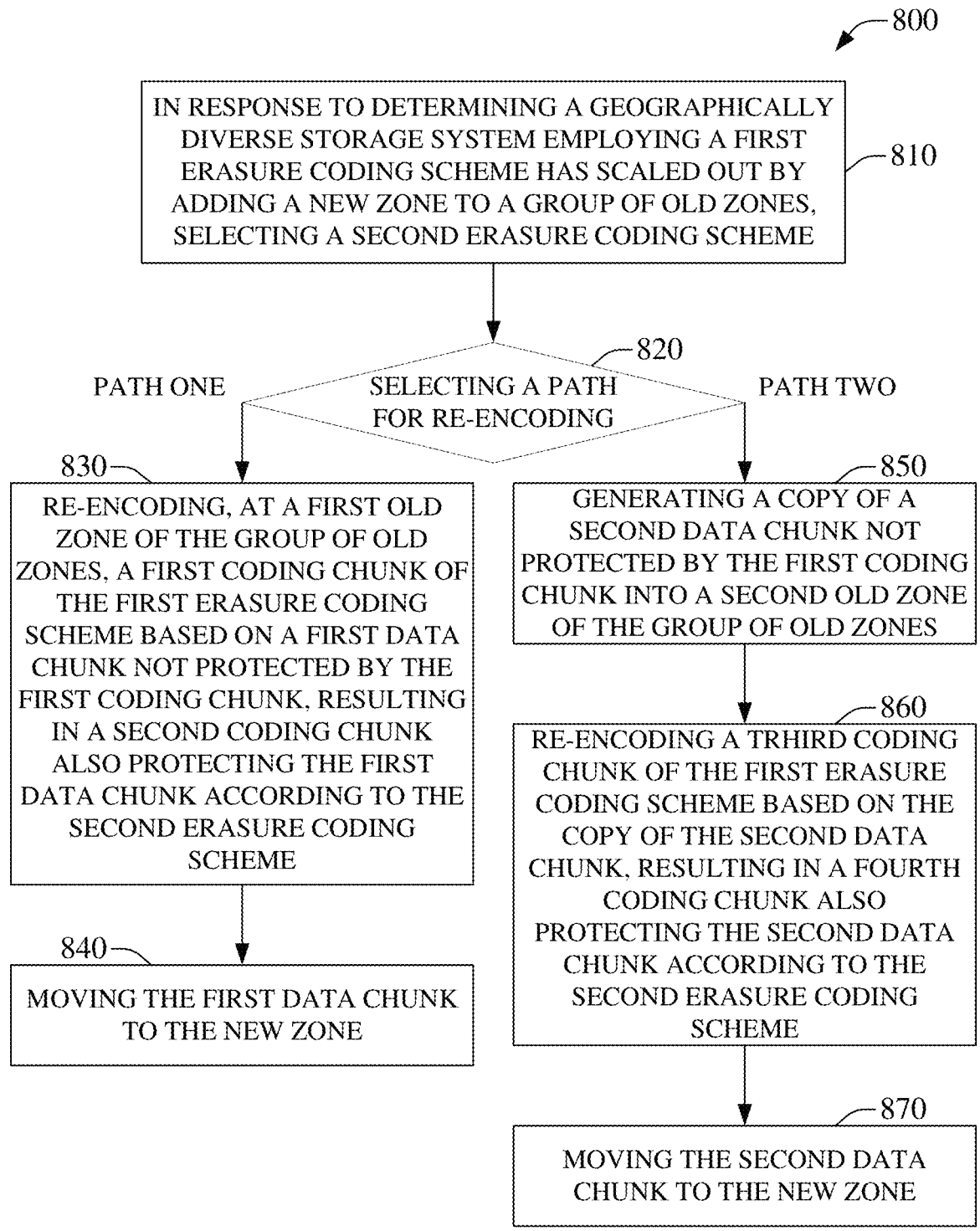
FIG. 8 illustrates an example method that enables preferentially storing data chunks on an added storage zone to facilitate addition of a storage zone to geographically diverse storage system employing erasure coding technology, in accordance with aspects of the subject disclosure.

In view of the example system(s) described above, example method(s) that can be implemented in accordance with the disclosed subject matter can be better appreciated with reference to flowcharts in FIG. 6-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 6 is an illustration of an example method 600 that can facilitate addition of a storage zone to geographically diverse storage zones of a geographically diverse storage construct employing erasure coding technology, in accordance with aspects of the subject disclosure. At 610, method 600 can comprise selecting a second erasure coding scheme in response to determining that an ECGEO has undergone a scaling out event, e.g., a new zone has been added to the ECGEO system. Where a new zone has been added, the additional storage space and location diversity of the new zone can allow for more diverse storage of data, e.g., data protection sets, etc., in a diverse manner. Additionally, the new erasure coding scheme, e.g., the second erasure coding scheme, can allow for lower storage overhead in data protection sets, as examples, a 4+2 EC scheme can have a 50% overhead as disclosed hereinabove, while a 5+2 EC scheme can have a lower 40% overhead, and a 10+2 EC scheme can have a mere 20% overhead.

Method 600, at 620, can cause re-encoding of a first coding chunk generated under the first erasure coding scheme. The re-encoding according to the second erasure coding scheme can be based on a data chunk that was not previously protected by the first coding chunk. As an example, in system 200 disclosed hereinabove, A1-D1_1 can be re-encoded based on E1 to generate A1-E1_1. The second coding chunk can now additionally provide data protection to the data chunk, e.g., A1-D1_1 did not provide data protection to E1, however, A1-E1_1 does provide data protection to E1.

At 730, method 600 can comprise storing a chunk, e.g., a data chunk, a coding chunk, etc., in a newly added zone of the geographically diverse storage system. At this point method 600 can end. In an aspect, the newly added zone can be part of the scaling out event. As an example, in system 200, A1-E1_1 can be stored in seventh ZSC 270 that was added to the previous ZSCs, e.g., 210-260, as part of scaling out system 200. As another example, in system 400, E2 can be stored in seventh ZSC 270 that was added to the previous ZSCs, e.g., 410-460, as part of scaling out system 400. In an aspect, storing of the chunk in the newly added zone can rebalance chunk storage in the scaled out ECGEO. This can be more apparent after cleaning up excessively redundant chunks, e.g., in system 200 deleting A1-D1_1, A1-D1_2, and E1', in system 400 moving E2 and deleting A2-D2_1 and A2-D2_2, etc., which can result in some older zones storing fewer chunks and new zones storing more chunks.

FIG. 7 is an illustration of an example method 700, which can facilitate preferentially storing coding chunks on an added storage zone to facilitate addition of a storage zone to geographically diverse storage system employing erasure coding technology, in accordance with aspects of the subject disclosure. At 710, method 700 can comprise selecting a second erasure coding scheme in response to determining that an ECGEO has undergone a scaling out event, e.g., a new zone has been added to a group of old zones comprising in the ECGEO system before the scaling out event. Where a new zone has been added, the additional storage space and location diversity of the new zone can allow for more diverse storage of data, e.g., data protection sets, etc., in a diverse manner. In an aspect, the new erasure coding scheme can allow for lower storage overhead in data protection sets.

Method 700, at 720, can select a re-encoding path. At 730, path one of method 700 can comprise re-encoding a first coding chunk, resulting in a second coding chunk. The re-encoding can occur at an old zone of the group of old zones, thereby reducing a computing burden for the new zone. The second coding chunk can be based on a data chunk that was not previously protected by the first coding chunk. As an example, in system 200, as disclosed hereinabove, A1-D1_1 can be re-encoded, at fifth ZSC 250, based on E1 to generate A1-E1_1. The second coding chunk can now additionally provide data protection to the data chunk, e.g., A1-D1_1 did not provide data protection to E1, however, A1-E1_1 does provide data protection to E1.

At 740, path one of method 700 can comprise causing the second coding chunk to be stored in the new zone. At this point, method 700 can end. In an aspect, storing of the second coding chunk in the new zone can serve to rebalance chunk storage in the scaled out ECGEO. This can be more apparent after cleaning up excessively redundant chunks, e.g., in system 200 deleting A1-D1_1, A1-D1_2, and E1', in system 400 moving E2 and deleting A2-D2_1 and A2-D2_2, etc., which can result in some older zones storing fewer chunks and new zones storing more chunks.

Where at 720 path two is selected, method 700 at 750 can comprise generating a copy of a second data chunk that is not protected by a third coding chunk. The copy can be located in a second old zone of the group of old zones. As an example, in system 200, E1 can be copied as E1', from fifth ZSC 250 into sixth ZSC 260.

At 760, path two of method 700 can comprise re-encoding the third coding chunk based on the copy of the second data chunk, resulting in a fourth coding chunk. The re-encoding can again occur at an old zone of the group of old zones, e.g., the second old zone, thereby reducing a computing burden for the new zone. As an example, in system 200, as disclosed hereinabove, A1-D1_2 can be re-encoded, at sixth ZSC 260, based on E1', e.g., a copy of E1 from fifth ZSC 250, to generate A1-E1_2. The fourth coding chunk, e.g., A1-E1_2 can now additionally provide data protection to the second data chunk, e.g., A1-D1_2 did not provide data protection to E1, however, A1-E1_2 does provide data protection to E1.

At 770, path two of method 700 can comprise causing the fourth coding chunk to be stored in the new zone. At this point, method 700 can end. In an aspect, storing of the fourth coding chunk can be equivalent to storing the second coding chunk, e.g., A1-E1_2 is redundant to, or a copy of, A1-E1_2. Moreover, storing of the fourth coding chunk in the new zone can serve to rebalance chunk storage in the scaled out ECGEO, which can result in some older zones storing fewer chunks and new zones storing more chunks.

In an aspect, some embodiments of method 700 can select either path one or path two based on metrics of the ECGEO, e.g., portions of networks can perform differently, different ZSCs can be experiencing different processing burdens, etc., and accordingly it can be more or less beneficial to perform re-encoding at some ZSCs than other, it can be more or less beneficial to copy data chunks between some zones than other zones, etc. In an embodiment, scaling component 190, 290, 490, etc., can enable selection of a path at 720. It is noted that in method 700, the newly added zone can store a re-encoded coding chunk, e.g., written to it by an older zone, copied to it from an older zone, etc., to preserve diversity according to the updated erasure coding scheme, e.g., in accord with the second erasure coding scheme of method 700.

FIG. 8 is an illustration of an example method 800, which can enable preferentially storing data chunks on an added storage zone to facilitate addition of a storage zone to geographically diverse storage system employing erasure coding technology, in accordance with aspects of the subject disclosure. At 810, method 800 can comprise selecting a second erasure coding scheme in response to determining that an ECGEO has undergone a scaling out event, e.g., a new zone has been added to a group of old zones comprising in the ECGEO system before the scaling out event. Where a new zone has been added, the additional storage space and location diversity of the new zone can allow for more diverse storage of data, e.g., data protection sets, etc., in a diverse manner. In an aspect, the new erasure coding scheme can allow for lower storage overhead in data protection sets.

Method 800, at 820, can select a re-encoding path. At 830, path one of method 800 can comprise re-encoding a first coding chunk, resulting in a second coding chunk. The re-encoding can occur at an old zone of the group of old zones, thereby reducing a computing burden for the new zone. The second coding chunk can be based on a data chunk that was not previously protected by the first coding chunk. As an example, in system 400, as disclosed hereinabove, A2-D2_2 can be re-encoded, at fifth ZSC 250, based on E2 to generate A2-E2_2. The second coding chunk can now additionally provide data protection to the data chunk, e.g., A2-D2_2 did not provide data protection to E2, however, A2-E2_2 does provide data protection to E2.

At 840, path one of method 800 can comprise moving the data chunk to be stored in the new zone. At this point, method 800 can end. In an aspect, storing of the data chunk, e.g., E2 in the new zone can serve to rebalance chunk storage in the scaled out ECGEO. This can be more apparent after cleaning up excessively redundant chunks, e.g., in system 400 deleting A2-D2_2, A2-D2_1, E2', and moving E2, can result in some older zones storing fewer chunks and new zones storing more chunks.

Where at 820 path two is selected, method 800 at 850 can comprise generating a copy of a second data chunk that is not protected by a third coding chunk. The copy can be located in a second old zone of the group of old zones. As an example, in system 400, E2 can be copied as E2', from fifth ZSC 450 into sixth ZSC 460.

At 860, path two of method 800 can comprise re-encoding the third coding chunk based on the copy of the second data chunk, resulting in a fourth coding chunk. The re-encoding can again occur at an old zone of the group of old zones, e.g., the second old zone, thereby reducing a computing burden for the new zone. As an example, in system 400, A2-D2_1 can be re-encoded, at sixth ZSC 460, based on E2', e.g., a copy of E2 from fifth ZSC 450, to generate A2-E2_1. The fourth coding chunk, e.g., A2-E2_1 can now additionally provide data protection to the second data chunk, e.g., A2-D2_1 did not provide data protection to E2, however, A2-E2_1 does provide data protection to E2.

At 870, path two of method 800 can comprise moving the data chunk to be stored in the new zone. At this point, method 800 can end. In an aspect, moving the data chunk can serve to rebalance chunk storage in the scaled out ECGEO, which can result in some older zones storing fewer chunks and new zones storing more chunks.

In an aspect, some embodiments of method 800 can select either path one or path two based on metrics of the ECGEO, e.g., portions of networks can perform differently, different ZSCs can be experiencing different processing burdens, etc., and accordingly it can be more or less beneficial to perform re-encoding at some ZSCs than other, it can be more or less beneficial to copy data chunks between some zones than other zones, etc. In an embodiment, scaling component 190, 290, 490, etc., can enable selection of a path at 820. It is noted that in method 800, the older zones can store a re-encoded coding chunk while the new zone can receive copies of data chunks, e.g., moving a data chunk from old zone to new zone, which can facilitate preserving diversity according to the updated erasure coding scheme, e.g., in accord with the second erasure coding scheme of method 800.

Figure 9:
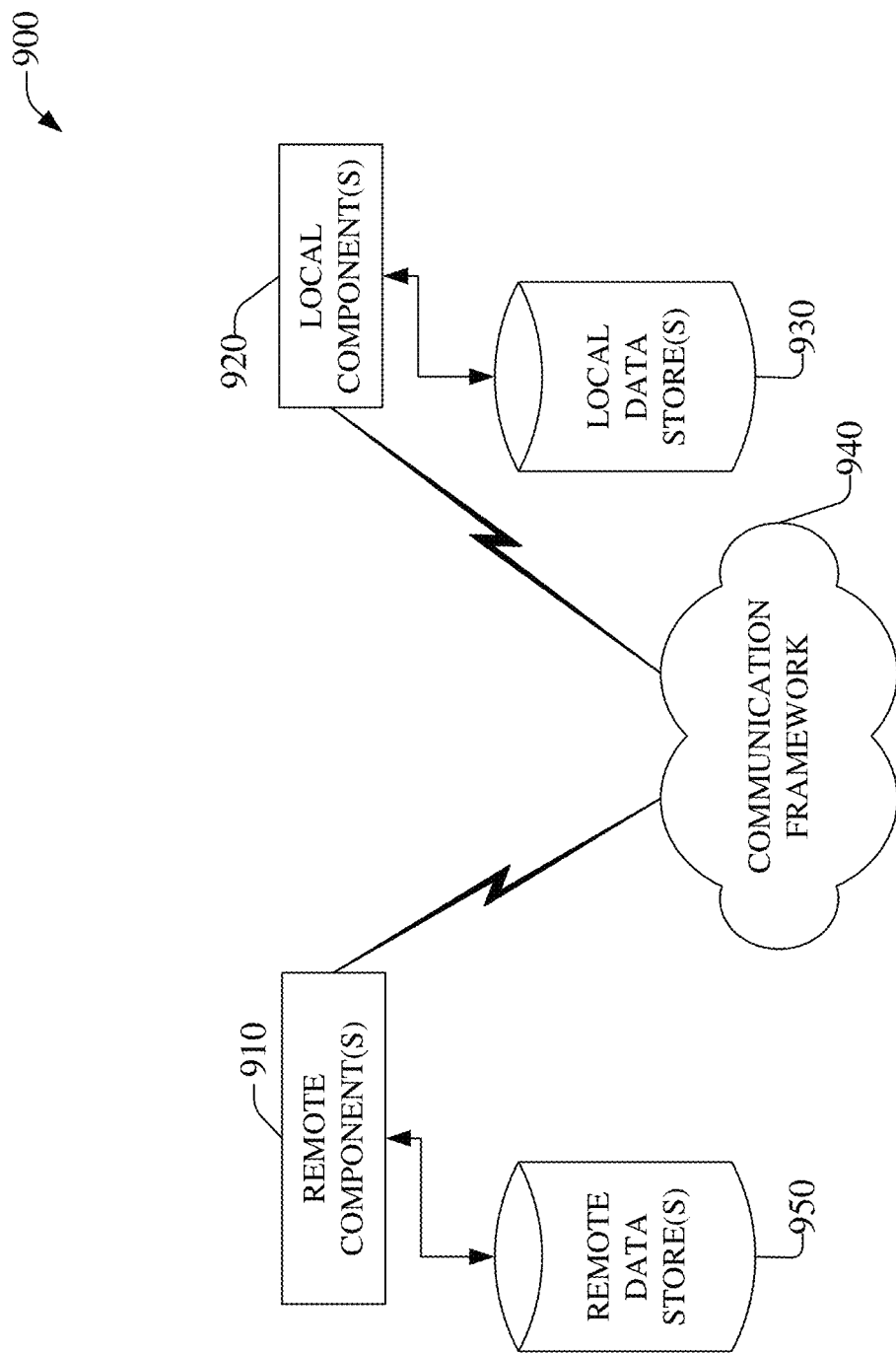
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC connected to a local ZSC via communication framework 940, etc. ZSC 110, 140, 160, 210, 220, 230, 240, 250, 260, 270, 310-370, 410-470, 510-570, etc., can each be located remotely from other ZSCs, and thus can be regarded as remote component(s) 910 where located remotely from a local component. Moreover, scaling component 190, 290, 490, etc., can be located remotely from, but communicate with, one or more of the ZSCs. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 940. In an aspect the remotely located ZSC or local ZSC can be embodied in ZSC 110, 140, 160, 210, 220, 230, 240, 250, 260, 270, 310-370, 410-470, 510-570, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, information corresponding to chunks stored on ZSCs can be communicated via communication framework 940 to other ZSCs of a storage network, e.g., to facilitate re-encoding of coding chunks, compression, storage in partial or complete chunks, deletion of chunks, etc.

Figure 10:
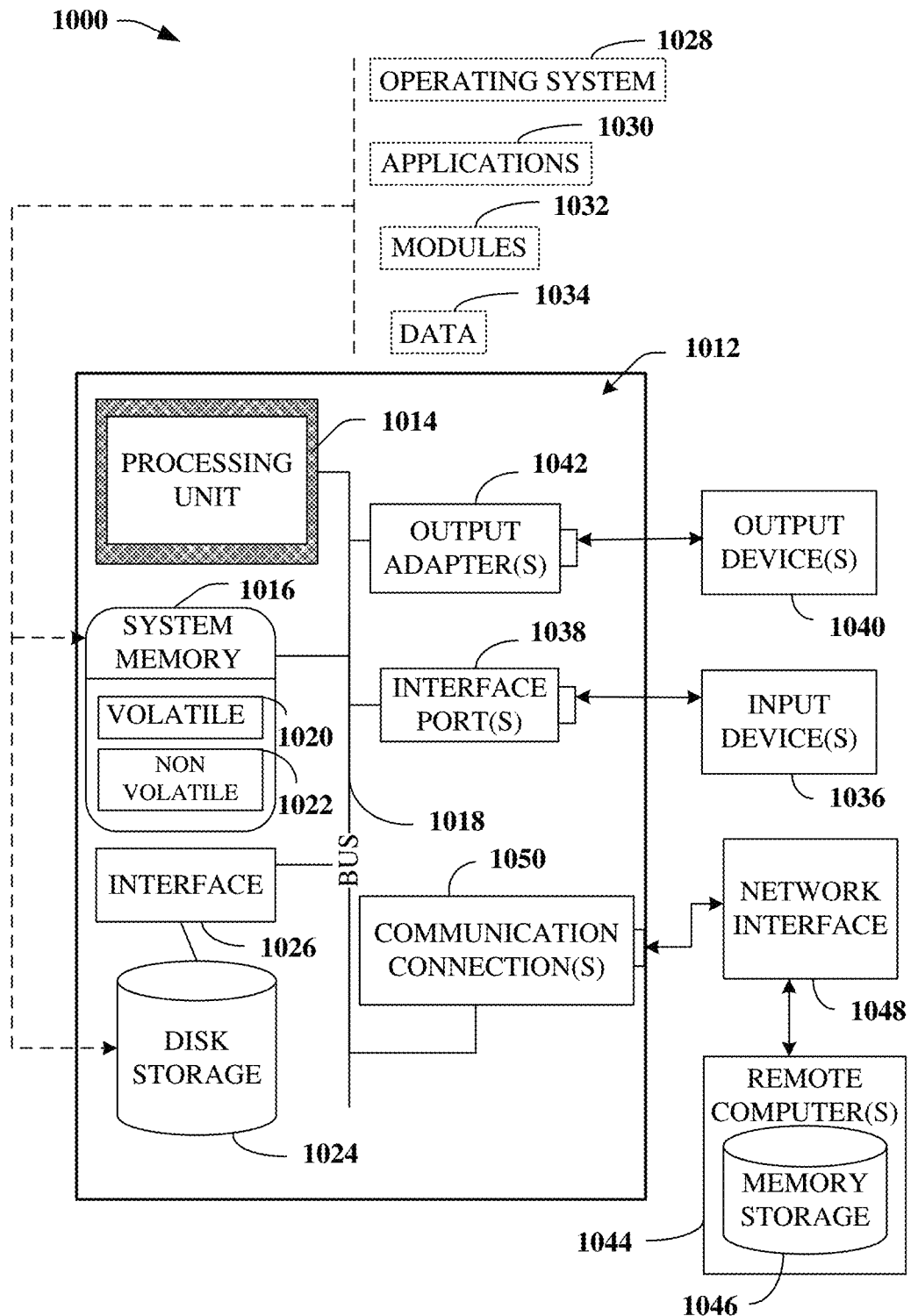
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in ZSC 110, 140, 160, 210, 220, 230, 240, 250, 260, 270, 310-370, 410-470, 510-570, etc., or in other components, such as scaling component 190, 290, 490, etc., can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synch-Link dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising selecting a second erasure coding scheme in response to determining that a new zone storage component has been added to a geographically diverse storage system comprising an old zone storage component and employing a first erasure coding scheme, and re-encoding an old coding chunk generated under the first erasure coding scheme, based on a data chunk not protected by the old coding chunk, resulting in a new coding chunk, wherein the new coding chunk protects the data chunk according to the second erasure coding scheme, as disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial bus port can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:

in response to determining, for a geographically diverse storage system comprising a first zone storage component and employing a first erasure coding scheme, that a second zone storage component has been added, selecting a second erasure coding scheme;

re-encoding a first coding chunk resulting in a second coding chunk, wherein the re-encoding is based on a representation of a data chunk not protected by the first coding chunk; and deleting a stored chunk resulting in the geographically diverse storage system being balanced differently than before the deleting the stored chunk.

2. The system of claim 1, wherein the operations further comprise moving the data chunk to the second zone storage component of the geographically diverse storage system.

3. The system of claim 1, wherein the operations further comprise moving the second coding chunk to the second zone storage component of the geographically diverse storage system.

4. The system of claim 1, wherein the representation of the data chunk not protected by the first coding chunk is the data chunk.

5. The system of claim 1, wherein the representation of the data chunk not protected by the first coding chunk is a copy of the data chunk.

6. The system of claim 1, wherein the second erasure coding scheme has a lower storage overhead than the first erasure coding scheme.

7. The system of claim 1, wherein the deleting the stored chunk comprises deleting a redundant data chunk resulting in the geographically diverse storage system being balanced differently than before the deleting the redundant data chunk.

8. The system of claim 1, wherein the operations further comprise deleting the stored chunk comprises deleting a redundant coding chunk resulting in the geographically diverse storage system being balanced differently than before the deleting the redundant data chunk.

9. The system of claim 1, wherein the re-encoding is performed by a zone storage component of the geographically diverse storage system other than the second zone storage component.

10. The system of claim 9, wherein the re-encoding is performed by the first zone storage component.

11. A method, comprising:
determining, by a system comprising a processor and a memory, that a geographically diverse storage system, comprising a pre-existing zone storage component and employing a first erasure coding scheme, has undergone a scaling out event resulting in a new zone storage component being added to the geographically diverse storage system;

selecting, by the system, a second erasure coding scheme based on a count of storage zones of the geographically diverse storage system after the scaling out event;

generating, by the system, based on a pre-existing coding chunk from the first erasure coding scheme and a data chunk not protected by the pre-existing coding chunk, a new coding chunk according to the second erasure coding scheme, wherein the new coding chunk protects the data chunk; and deleting, by the system, a stored chunk thereby altering a storage balance of the geographically diverse storage system.

12. The method of claim 11, further comprising:
moving, by the system, the data chunk to the second zone storage component of the geographically diverse storage system; and freeing, by the system, storage space associated with the pre-existing coding chunk.

13. The method of claim 11, wherein the generating the new coding chunk results in the new coding chunk being stored, by the system, in the new zone storage component.

14. The method of claim 11, wherein, for the generating the new coding chunk, the data chunk is a copy of another data chunk that is not protected by the pre-existing coding chunk.

15. The method of claim 11, wherein the generating the new coding chunk occurs in the pre-existing zone storage component of the geographically diverse storage system.

16. The method of claim 11, wherein the selecting the second erasure coding scheme comprises selecting a Reed-Solomon type erasure coding scheme.

17. A non-transitory machine-readable medium, comprising executable instructions that, when executed by a processor, facilitate performance of operations, comprising:
in response to determining that a new zone storage component has been added to a geographically diverse storage system comprising a pre-existing zone storage component and employing a first erasure coding scheme, selecting a second erasure coding scheme;

re-encoding a pre-existing coding chunk generated under the first erasure coding scheme, based on a data chunk not protected by the pre-existing coding chunk, the re-encoding resulting in a new coding chunk, wherein the new coding chunk protects the data chunk according to the second erasure coding scheme; and causing a storage balance of the geographically diverse storage system to be altered as a result of deleting a stored chunk; wherein protection of the stored chunk is via the first erasure coding scheme.

18. The non-transitory machine-readable medium of claim 17, wherein the operations further comprise moving the data chunk to the new zone storage component of the geographically diverse storage system.

19. The non-transitory machine-readable medium of claim 17, wherein the operations further comprise moving the new coding chunk to the new zone storage component of the geographically diverse storage system.

20. The non-transitory machine-readable medium of claim 17, wherein second erasure coding scheme has a lower storage overhead than the first erasure coding scheme.

* * * * *